US012347794B2

(12) United States Patent
Chen et al.

(10) Patent No.: US 12,347,794 B2
(45) Date of Patent: Jul. 1, 2025

(54) SEAL RING WITH CONTINUOUS RING SHAPE FEATURES FOR SEMICONDUCTOR DEVICE WITH GATE-ALL-AROUND TRANSISTORS

(71) Applicant: Taiwan Semiconductor Manufacturing Company, Ltd., Hsinchu (TW)

(72) Inventors: Chun Yu Chen, Hsinchu (TW); Yen Lian Lai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 472 days.

(21) Appl. No.: 17/723,193

(22) Filed: Apr. 18, 2022

(65) Prior Publication Data

US 2023/0019608 A1 Jan. 19, 2023

Related U.S. Application Data

(60) Provisional application No. 63/219,932, filed on Jul. 9, 2021.

(51) Int. Cl.
*H01L 23/58* (2006.01)
*H10D 30/67* (2025.01)
(Continued)

(52) U.S. Cl.
CPC ....... *H01L 23/585* (2013.01); *H10D 30/6735* (2025.01); *H10D 64/017* (2025.01); *H10D 84/017* (2025.01); *H10D 84/038* (2025.01)

(58) Field of Classification Search
CPC .............. H01L 29/401; H01L 21/0259; H01L 21/28088; H01L 21/32133; H01L 29/0665;
(Continued)

(56) References Cited

U.S. PATENT DOCUMENTS 7,235,864 B2    6/2007  Lee
8,022,550 B2    9/2011  Koubuchi et al.
(Continued)

OTHER PUBLICATIONS

Huang et al., "Dummy Patterns in Redundant Region of Double Seal Ring", U.S. Appl. No. 17/336,977, filed Jun. 2, 2021, Assignee: Taiwan Semiconductor Manufacturing Company, Ltd., 24 pages specification, 8 pages drawings.

*Primary Examiner* — Caleb E Henry
(74) *Attorney, Agent, or Firm* — HAYNES AND BOONE, LLP

(57) ABSTRACT

A semiconductor structure includes a substrate, a circuit region, and a seal ring surrounding the circuit region. The circuit region includes two first source/drains, first semiconductor layers connecting the two first source/drains, and a first gate disposed between the two first source/drains and wrapping around each of the first semiconductor layers. The seal ring includes two epitaxially grown semiconductor structures, second semiconductor layers, third semiconductor layers, and a second gate. The second and the third semiconductor layers are alternately stacked one over another to form a stack of layers. A topmost layer of the stack is one of the third semiconductor layers. The second gate is disposed between the two epitaxially grown semiconductor structures and above the topmost layer of the stack. The first and the third semiconductor layers include a first semiconductor material. The second semiconductor layers include a second semiconductor material different from the first semiconductor material.

20 Claims, 25 Drawing Sheets

(51) Int. Cl.
*H10D 64/01* (2025.01)
*H10D 84/01* (2025.01)
*H10D 84/03* (2025.01)

(58) Field of Classification Search
CPC .......... H01L 29/42392; H01L 29/4908; H01L 29/4991; H01L 29/66742; H01L 29/78696; H01L 21/76834; H01L 21/76897; H01L 21/82345; H01L 27/088; H01L 21/823475; H01L 29/267; H01L 29/42376; H01L 29/4958; H01L 29/6656; H01L 29/66439; H01L 29/6653; H01L 29/66545; H01L 29/775; H01L 21/76224; H01L 29/165; H01L 29/4966; H01L 29/7848; H01L 29/0673; B82Y 10/00

See application file for complete search history.

(56) References Cited

U.S. PATENT DOCUMENTS

| | | | | |
|---|---|---|---|---|
| 8,253,217 | B2* | 8/2012 | Chen | H01L 23/585 |
| | | | | 257/503 |
| 8,334,582 | B2* | 12/2012 | Jeng | H01L 21/78 |
| | | | | 257/E23.116 |
| 8,395,239 | B2* | 3/2013 | Chen | H01L 24/14 |
| | | | | 257/737 |
| 8,461,021 | B2* | 6/2013 | Yaung | H01L 21/78 |
| | | | | 438/460 |
| 8,530,997 | B1* | 9/2013 | Yang | H01L 21/4814 |
| | | | | 438/618 |
| 8,835,323 | B1 | 9/2014 | Shieh et al. | |
| 9,093,308 | B2 | 7/2015 | Yang et al. | |
| 9,245,842 | B2* | 1/2016 | Chen | H01L 23/5283 |
| 9,437,739 | B2* | 9/2016 | Yu | H01L 21/823431 |
| 9,443,838 | B2 | 9/2016 | Yang et al. | |
| 9,837,366 | B1* | 12/2017 | Liu | H01L 21/78 |
| 9,946,827 | B2 | 4/2018 | Wang et al. | |
| 10,074,618 | B1* | 9/2018 | Chen | H01L 24/19 |
| 10,229,889 | B2 | 3/2019 | Tatour et al. | |
| 10,366,956 | B2* | 7/2019 | Yang | H01L 23/564 |
| 10,373,865 | B2* | 8/2019 | Yang | H01L 25/0655 |
| 10,510,871 | B1* | 12/2019 | More | H01L 29/0847 |
| 10,692,770 | B2* | 6/2020 | Wu | H01L 21/823456 |
| 10,714,598 | B2* | 7/2020 | Wang | H01L 29/66545 |
| 11,043,580 | B2* | 6/2021 | Wang | H01L 21/28176 |
| 11,201,106 | B2 | 12/2021 | Chen et al. | |
| 11,380,548 | B2* | 7/2022 | Chen | H10D 30/024 |
| 11,677,012 | B2* | 6/2023 | Wang | H01L 21/28176 |
| | | | | 438/283 |
| 2011/0309465 | A1* | 12/2011 | Chen | H01L 23/585 |
| | | | | 257/503 |
| 2012/0038028 | A1* | 2/2012 | Yaung | H01L 21/78 |
| | | | | 257/E23.18 |
| 2012/0175728 | A1* | 7/2012 | Yang | H01L 23/564 |
| | | | | 257/E21.24 |
| 2014/0327115 | A1 | 11/2014 | Vu et al. | |
| 2015/0162285 | A1* | 6/2015 | Ning | H01L 21/76802 |
| | | | | 257/751 |
| 2015/0221884 | A1* | 8/2015 | Han | H10K 10/484 |
| | | | | 257/29 |
| 2016/0020181 | A1* | 1/2016 | Yu | H01L 23/3171 |
| | | | | 257/737 |
| 2016/0380056 | A1* | 12/2016 | Yeo | H01L 29/42392 |
| | | | | 438/283 |
| 2018/0025997 | A1* | 1/2018 | Lai | H01L 23/5226 |
| | | | | 257/503 |
| 2018/0047680 | A1* | 2/2018 | Uchida | H01L 23/564 |
| 2018/0122751 | A1* | 5/2018 | Chen | H01L 23/5389 |
| 2018/0277448 | A1* | 9/2018 | Chen | H01L 29/517 |
| 2020/0105932 | A1* | 4/2020 | Li | H01L 29/785 |
| 2020/0135889 | A1* | 4/2020 | Chien | H01L 29/66825 |
| 2020/0168507 | A1* | 5/2020 | Chang | H01L 21/324 |
| 2021/0050429 | A1* | 2/2021 | Lin | H01L 29/4991 |
| 2021/0305381 | A1 | 9/2021 | Chiang et al. | |
| 2021/0305408 | A1 | 9/2021 | Yu et al. | |
| 2021/0313456 | A1* | 10/2021 | Wang | H01L 21/26586 |
| 2022/0051993 | A1 | 2/2022 | Chen | |

* cited by examiner

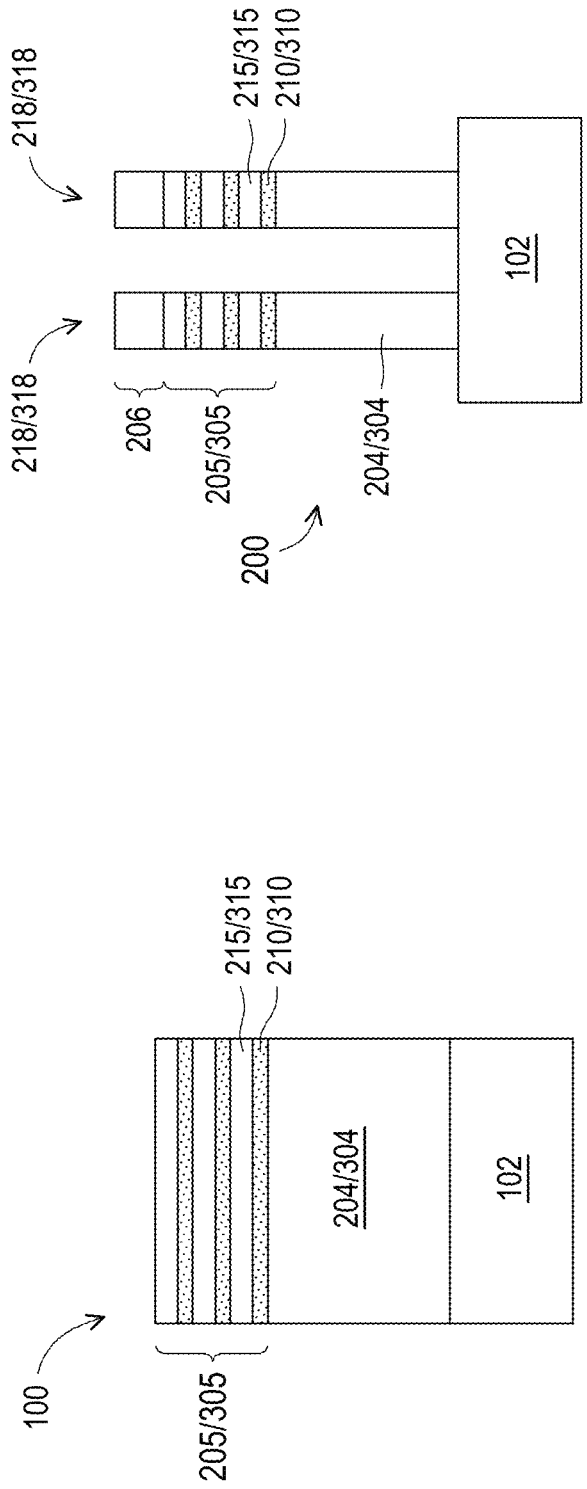

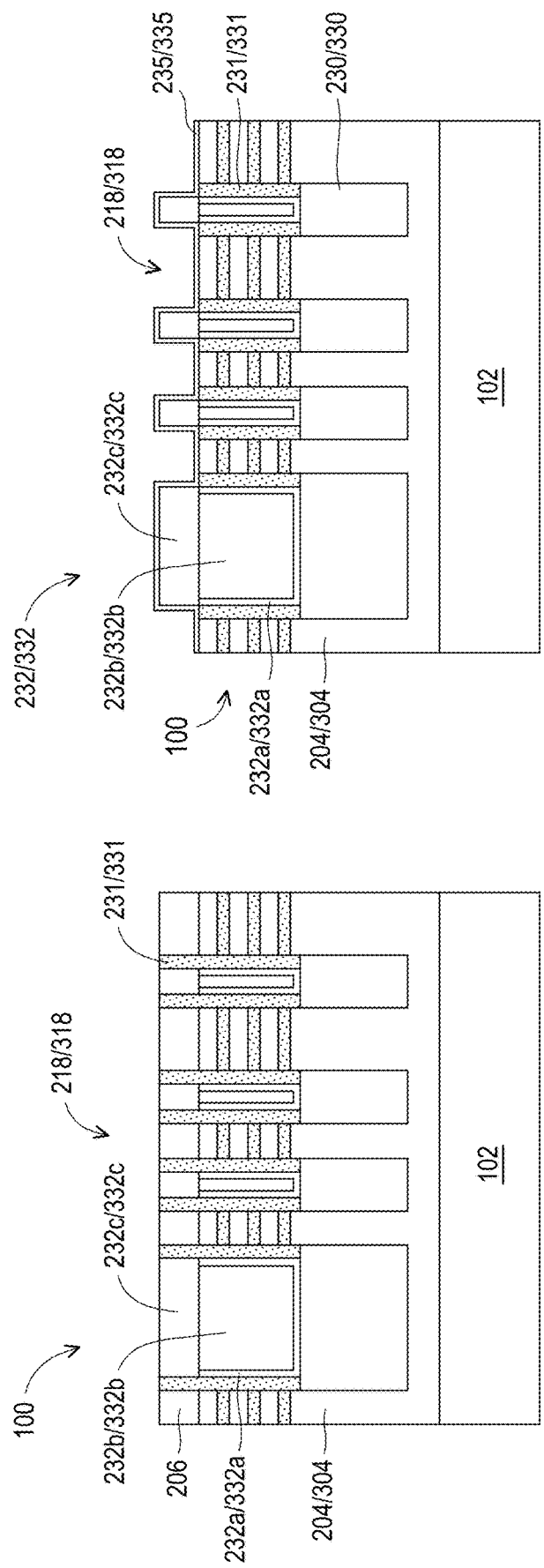

US 12,347,794 B2

SEAL RING WITH CONTINUOUS RING SHAPE FEATURES FOR SEMICONDUCTOR DEVICE WITH GATE-ALL-AROUND TRANSISTORS

PRIORITY

This application claims the benefits to U.S. Provisional Application Ser. No. 63/219,932 filed Jul. 9, 2021, the entire disclosure of which is incorporated herein by reference.

BACKGROUND

In semiconductor technologies, a semiconductor wafer is processed through various fabrication steps to form integrated circuits (IC). Typically, several circuits or IC dies are formed onto the same semiconductor wafer. The wafer is then diced to cut out the circuits formed thereon. To protect the circuits from moisture degradation, ionic contamination, and dicing processes, a seal ring is formed around each IC die. This seal ring is formed during fabrication of the many layers that comprise the circuits, including both the front-end-of-line (FEOL) processing and back-end-of-line processing (BEOL). The FEOL includes forming transistors, capacitors, diodes, and/or resistors onto the semiconductor substrate. The BEOL includes forming metal layer interconnects and vias that provide routing to the components of the FEOL.

Although existing seal ring structures and fabrication methods have been generally adequate for their intended purposes, improvements are desired. For example, it is desired to improve seal rings for protecting gate-all-around devices such as nanosheet devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, 3C, 3D, 3E, 3F, 3G, 3H, 3I, 3J, 3K, and 3L are cross-sectional views of a semiconductor structure during fabrication stages according to an embodiment of the method of FIG. 2, according to aspects of the present disclosure.

DETAILED DESCRIPTION

Figure 1A:
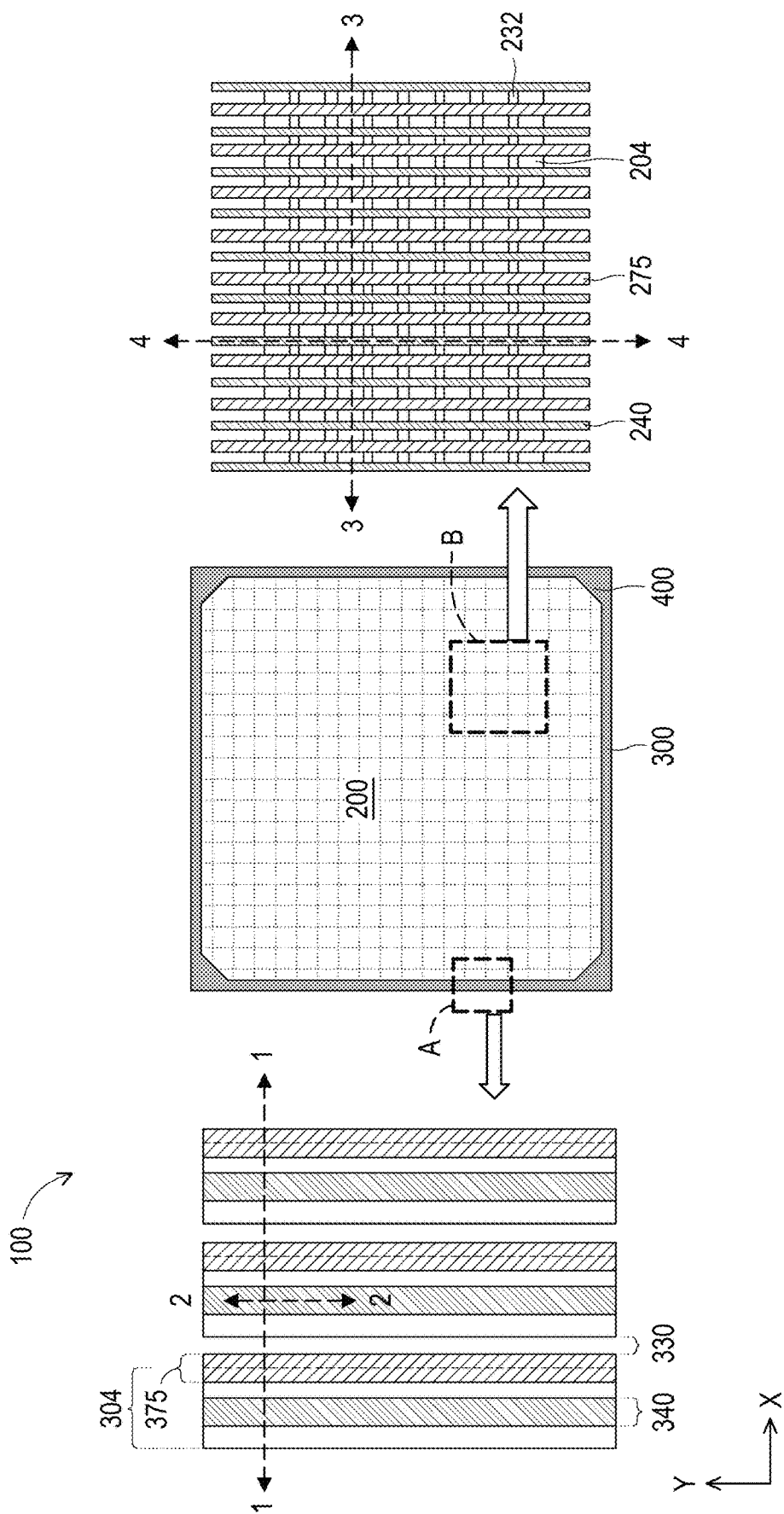
FIG. 1A is a top plan view of a semiconductor structure with a seal ring according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to providing a seal ring that is compatible with a circuit region having gate-all-around (GAA) transistors. In other words, the seal ring surrounds one or more circuit dies that include GAA transistors. A GAA transistor (or GAA device) refers to a vertically-stacked horizontally-oriented multi-channel transistor, such as a nanowire transistor or a nanosheet transistor. GAA transistors are promising candidates to take CMOS to the next stage of the roadmap due to their better gate control ability, lower leakage current, and fully FinFET device layout compatibility. However, many challenges remain, one of which is how to make reliable seal rings that are compatible with the processes for making GAA transistors. Embodiments of the present disclosure provide such seal rings among other things.

According to an embodiment of the present disclosure, the seal ring is initially provided with stacked semiconductor layers (such as alternately stacked silicon and silicon germanium layers) and sacrificial gate structures (for example, polysilicon (or poly) gates) above the stacked semiconductor layers, just like in the GAA transistors prior to metal-gate replacement. Then, in subsequent fabrication stages, the poly gates in both the seal ring area and the die area are removed. Then, in the die area, the stacked semiconductor layers undergo a process referred to as "channel release" where some semiconductor layers are selectively removed, and other semiconductor layers remain as the transistor channels. At the same time, the stacked semiconductor layers in the seal ring are preserved and do not go through the channel release process. As a result, the alternately stacked semiconductor layers remain in the seal ring to make more stable and robust seal ring wall. Subsequently, high-k metal gates (HKMG) are formed in both the seal ring and the circuit die areas, followed by mid-end-of-line (MEOL) and back-end-of-line (BEOL) processes. Those of ordinary skill in the art should appreciate that they may readily use the present disclosure as a basis for designing or modifying other processes and structures for carrying out the same purposes and/or achieving the same advantages of the embodiments introduced herein.

FIG. 1A is a top plan view of the semiconductor structure 100 according to the present disclosure. The semiconductor structure 100 (such as a manufactured wafer or a part thereof) includes a seal ring 300 that encloses a circuit region (or IC die) 200. In embodiments, the semiconductor structure 100 may include other seal ring(s) enclosing the seal ring 300 or other seal ring(s) enclosed by the seal ring 300. Also, seal ring 300 may enclose other circuit region(s). The circuit region 200 may include any circuits, such as memory, processor, transmitter, receiver, and so on. The exact functionality of the circuit region 200 is not limited by the present disclosure. In the present disclosure, the circuit region 200 includes GAA transistors, which will be further discussed.

In the present embodiment, the seal ring 300 has a rectangular or substantially rectangular periphery and further includes four corner seal ring (CSR) structures 400 at the four interior corners of the rectangular or substantially rectangular periphery. In an embodiment, the CSR structure 400 is triangular or substantially triangular and provides various mechanical and structural benefits to the seal ring 300, such as preventing layer peeling at the corner of the chips during dicing processes. In other embodiments, the CSR structures 400 may be omitted in the seal ring 300. Further, the seal ring 300 may have non-rectangular shape. In the present embodiment, the seal ring 300 fully surrounds the circuit region 200. In other embodiments, the seal ring 300 may provide openings in selected locations in selected layers to allow interconnects between the circuit region 200 and other circuit regions not shown in FIG. 1A.

Referring to the zoomed-in view of the area B, the circuit region 200 includes semiconductor layers 204 and dummy fins 232 oriented lengthwise along the "x" direction, and further includes gate structures 240 and contacts 275 oriented lengthwise along the "y" direction. The above elements form a matrix, and transistors (such as GAA transistors) are formed in the intersections between the semiconductor layers 204 and the gate structures 240. Referring to the zoomed-in view of the area A, the seal ring 300 includes semiconductor layers 304, gate structures 340 and contact structures 375 disposed over the semiconductor layers 304, and isolation structures 330 between semiconductor layers 304. Each of the semiconductor layers 304, gate structures 340, contacts 375, and isolation structures 330 (as well as dummy fins 332 shown in FIG. 1B) forms a generally ring shape surrounding the circuit region 200. In this embodiment, the width of the gate structure 340 is narrower than the width of the semiconductor layer 304 from the top view. The gate structure 340 is disposed completely within the boundary of the semiconductor layer 304 from the top view, without extending to the isolation structures 330.

FIGS. 1B, 1C, 1D, and 1E are cross-sectional views of a portion of the semiconductor structure 100 along the "1-1," "2-2," "3-3," and "4-4" lines in FIG. 1A, respectively, according to aspects of the present disclosure. Referring to FIGS. 1B, 1C, 1D, and 1E collectively, the seal ring 300 and the circuit region 200 are formed on or in a substrate 102. The substrate 102 is a silicon substrate in the present embodiment. The substrate 102 may alternatively include other semiconductor materials in various embodiments, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. The substrate 102 may include doped semiconductor layers such as P-wells and/or N-wells. Furthermore, the substrate 102 may be a semiconductor on insulator substrate such as silicon on insulator (SOI) substrate.

Semiconductor layers 204 and 304 may include the same semiconductor material such as silicon, silicon germanium, germanium, or other suitable semiconductor materials. Further, semiconductor layers 204 and 304 may include N-type doped regions formed by doping the semiconductor material with n-type dopants, such as phosphorus, arsenic, other n-type dopant, or combinations thereof; and/or P-type doped regions formed by doping the semiconductor material with p-type dopants, such as boron, indium, other p-type dopant, or combinations thereof.

The semiconductor structure 100 further includes isolation structures 230 in the circuit region 200 and isolation structures 330 in the seal ring 300. The isolation structures 230 isolate the semiconductor layers 204 one from another. The isolation structures 330 isolate the semiconductor layers 304 one from another. In an embodiment, isolation structures 230 and 330 may be formed by the same process and include the same material. For example, isolation structures 230 and 330 may include silicon oxide, silicon nitride, silicon oxynitride, other suitable isolation material (for example, including silicon, oxygen, nitrogen, carbon, or other suitable isolation constituent), or combinations thereof. Isolation structures 230 and 330 may include shallow trench isolation (STI), deep trench isolation (DTI), or other types of isolation.

Figure 1B:
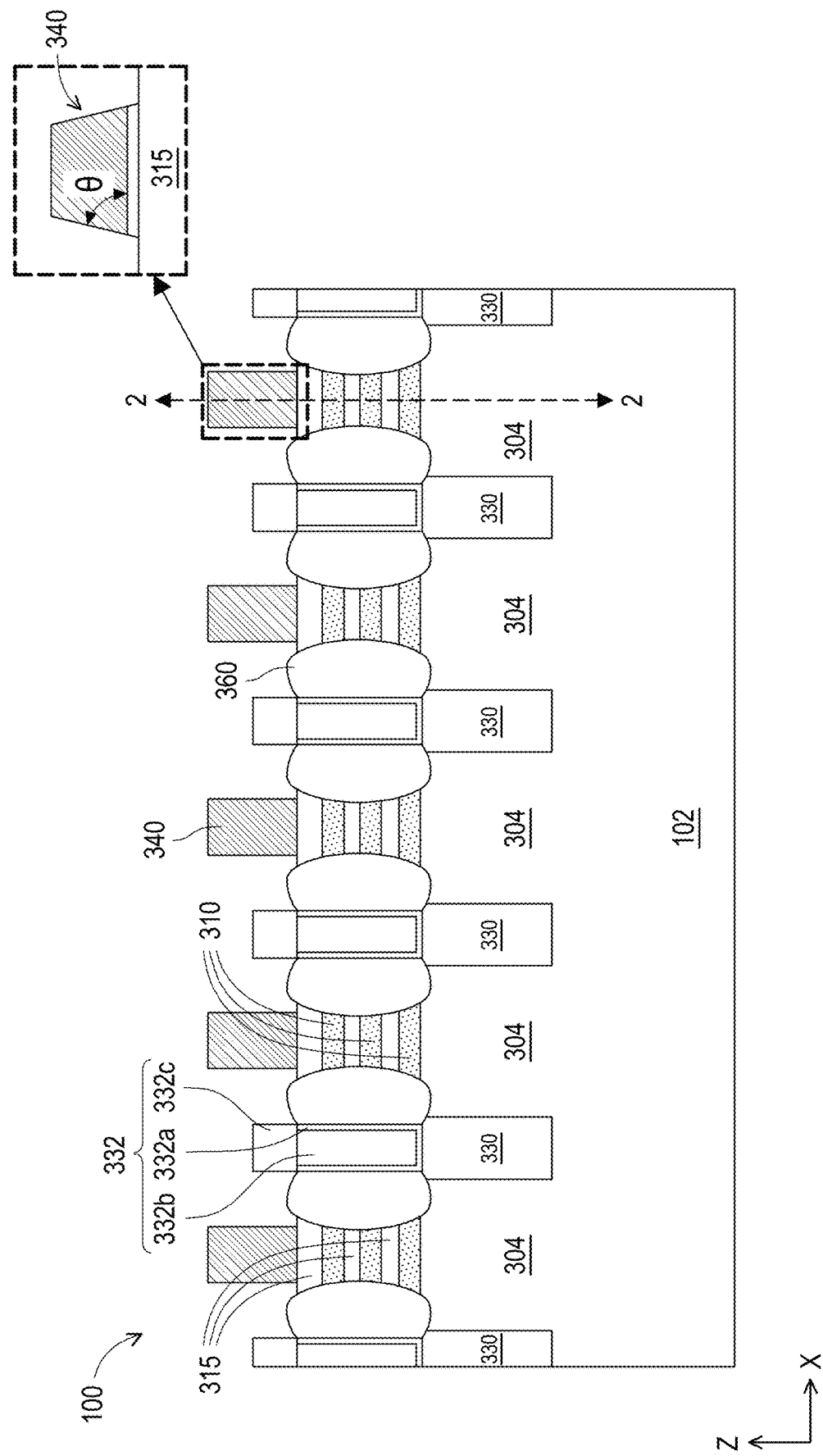
FIGS. 1B, 1C, 1D, and 1E are cross-sectional views of the semiconductor structure in FIG. 1A along the "1-1," "2-2," "3-3," and "4-4" lines in FIG. 1A, respectively, according to aspects of the present disclosure.
Figure 1C:
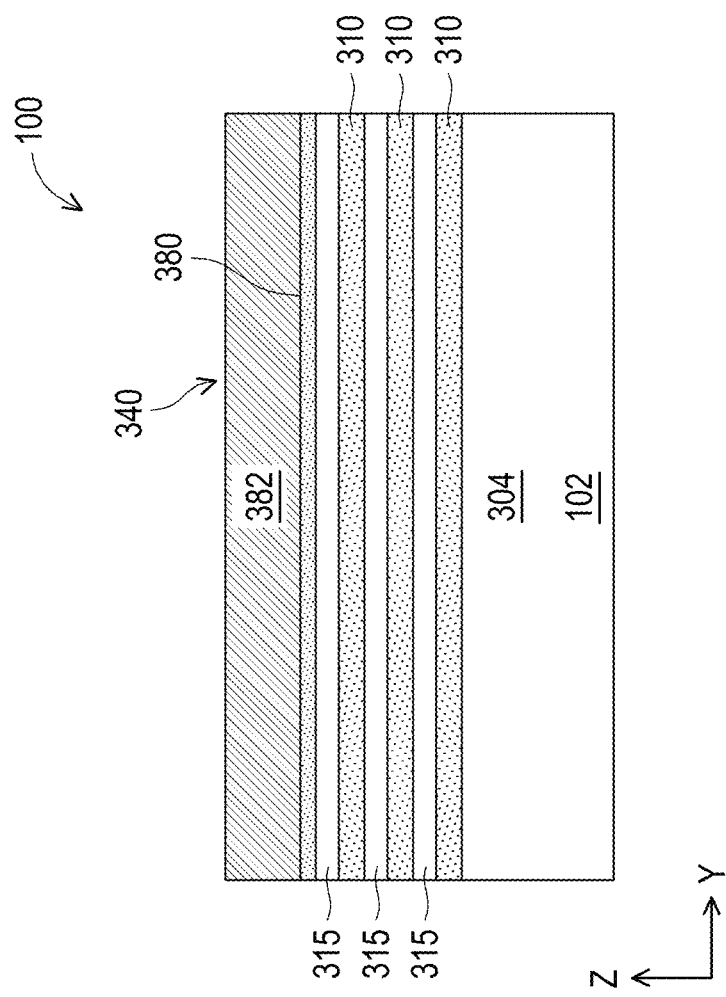
Figure 1D:
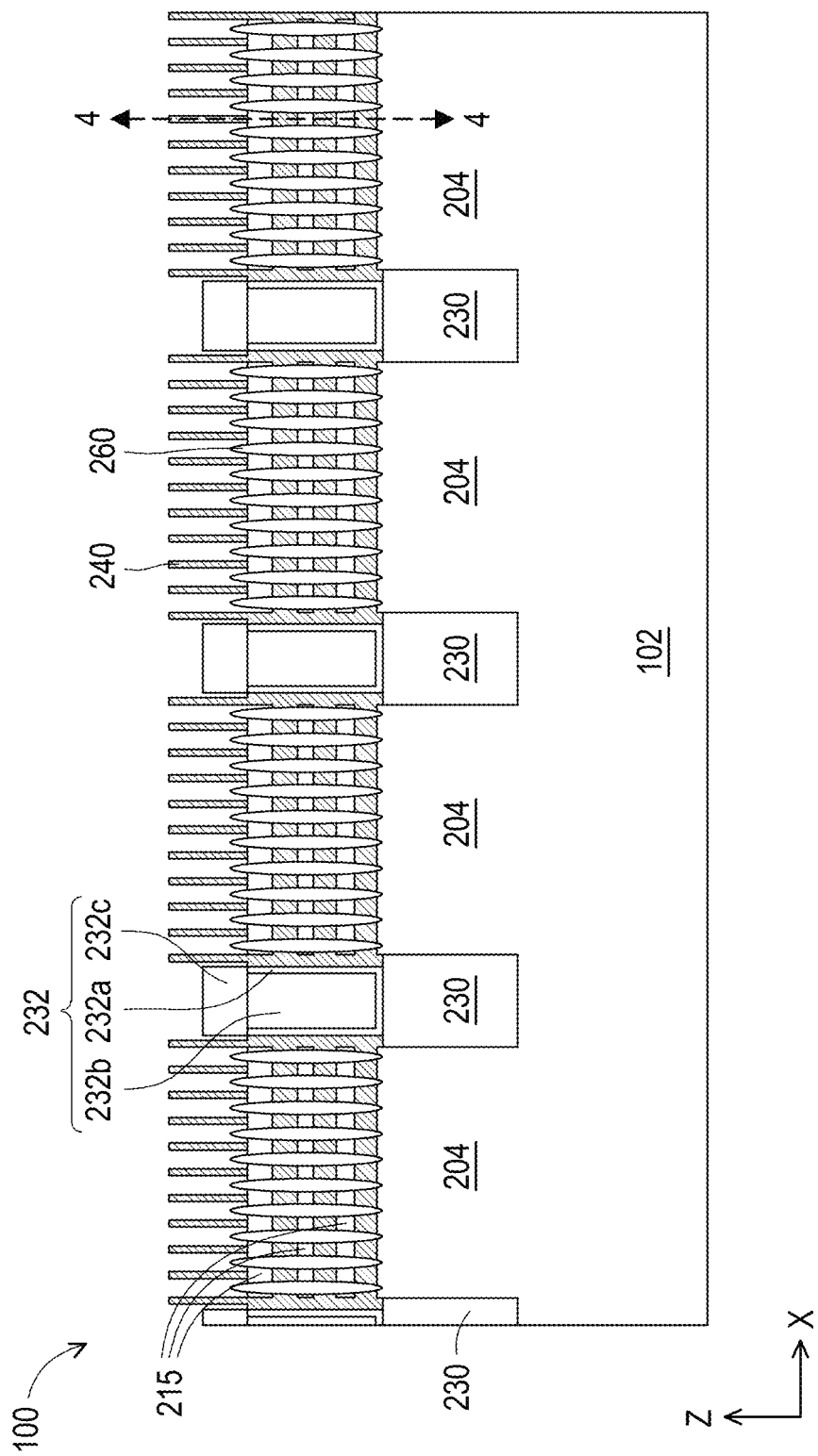
Figure 1E:
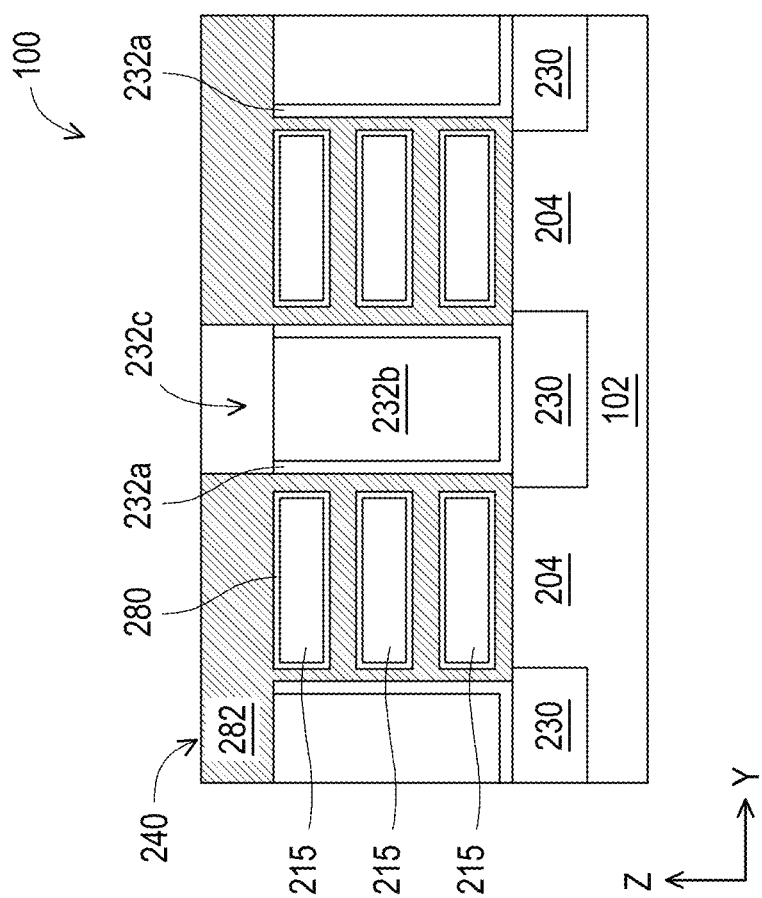

Referring to FIGS. 1B and 1C, the semiconductor structure 100 further includes a stack of semiconductor layers 310 and 315 in the seal ring 300. The semiconductor layers 310 and 315 are stacked vertically (along the z-direction) in an interleaving or alternating configuration from a surface of the substrate 102. Referring to FIGS. 1D and 1E, the semiconductor structure 100 further includes a stack of semiconductor layers 215 in the circuit region 200. The semiconductor layers 215 are stacked vertically (along the z-direction) from a surface of the substrate 102. In an embodiment, the semiconductor structure 100 initially includes a stack of semiconductor layers 210 (not shown in FIGS. 1D and 1E but shown in FIGS. 3A and 3B) and 215 in the circuit region 200, like the semiconductor layers 310 and 315 in the seal ring 300. Then, the semiconductor layers 210 are subsequently removed, which will be further discussed.

A composition of semiconductor layers 310 (and 210) is different than a composition of semiconductor layers 315 and 215 to achieve etch selectivity. For example, semiconductor layers 310 (and 210) include silicon germanium and semiconductor layers 315 and 215 include silicon. In some embodiments, semiconductor layers 310 (and 210) and semiconductor layers 315 and 215 can include the same material but with different constituent atomic percentages. For example, semiconductor layers 310 (and 210) and semiconductor layers 315 and 215 can include silicon germanium, where semiconductor layers 310 (and 210) have a first silicon atomic percent and/or a first germanium atomic percent and semiconductor layers 315 and 215 have a second, different silicon atomic percent and/or a second, different germanium atomic percent. The present disclosure contemplates that semiconductor layers 310 (and 210) and semiconductor layers 315 and 215 include any combination of semiconductor materials that can provide desired etching selectivity, desired oxidation rate differences, and/or desired performance characteristics (e.g., materials that maximize current flow), including any of the semiconductor materials disclosed herein.

Referring to FIGS. 1B and 1D, the semiconductor structure 100 further includes epitaxially grown semiconductor layers (EPIs) 360 in seal ring 300 and EPIs 260 in circuit region 200. For n-type transistors, EPIs 260 may include silicon and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). For p-type transistors, EPIs 260 may include silicon germanium or germanium and can be doped with boron, other p-type dopant, or combinations thereof (for example, forming Si:Ge:B epitaxial source/drain features). EPIs 360 may include the same material as EPIs 260.

Referring to FIGS. 1B, 1D, and 1E, the semiconductor structure 100 further includes dummy fins (or isolation fins) 232 in circuit region 200 and dummy fins (or isolation fins) 332 in seal ring 300. The dummy fins 232 and 332 are disposed over the isolation structures 230 and 330, respectively. Each of the dummy fins 232 and 332 is a multi-layered structure. In the present embodiment, dummy fin 232 includes dielectric layers 232a, 232b, and 232c; and dummy fin 332 includes dielectric layers 332a, 332b, and 332c. The dummy fins 232 and 332 may be formed by the same process and include the same materials. Dielectric layers 232a and 332a may include a low-k dielectric material such as a dielectric material including Si, O, N, and C. Low-k dielectric material generally refers to dielectric materials having a low dielectric constant, for example, lower than that of silicon oxide (k≈3.9). Dielectric layers 232b and 332b may include silicon oxide, silicon nitride, silicon oxynitride, TEOS formed oxide, PSG, BPSG, low-k dielectric material, other suitable dielectric material, or combinations thereof. Dielectric layers 232c and 332c may include a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), (Ba, Sr)$TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). Dummy fins 232 and isolation structures 230 collectively separate semiconductor layers 204, semiconductor layers 215, and EPIs 260 along the "x" direction (FIG. 1D) and the "y" direction (FIG. 1E). In the portion of the semiconductor structure shown in the area B in FIG. 1A, the dummy fins 232 are shown as oriented lengthwise along the "x" direction, and dummy fins 232 oriented lengthwise along the "y" direction also exist, although not shown.

Referring to FIGS. 1B, 1D, 1C, and 1E, the semiconductor structure 100 further includes gate structures 240 and 340 in circuit regions 200 and seal ring 300, respectively. Gate structure 240 includes gate dielectric layer 280 and gate electrode 282 over the gate dielectric layer 280. Gate structure 240 wraps around the semiconductor layers 215 (FIGS. 1D and 1E) to form gate-all-around transistors. Dummy fins 232 separate some of the gate structures 240 along the "y" direction. Gate structure 340 includes gate dielectric layer 380 and gate electrode 382 over the gate dielectric layer 380. Gate structure 340 is disposed above the topmost layer in the stack of semiconductor layers 315 and 310 and does not wrap around the semiconductor layers 315 and 310. The stack of semiconductor layers 315 and 310 provide stable and robust structure for the seal ring 300. Gate structure 340 forms a continuous ring shape (see FIG. 1A). Gate structure 340 may have a tapered profile (i.e., having tapered sidewalls) where its sidewall may form an angle θ with the top surface of the topmost layer in the stack of semiconductor layers 315 and 310. In some embodiment, the angle θ may be in a range of about 88 degrees to about 90 degrees. In the present embodiment, gate structures 240 and 340 each includes a high-k metal gate. For example, the gate dielectric layers 280 and 380 may include a high-k gate dielectric material while the gate electrodes 282 and 382 may include a metal electrode. The semiconductor structure 100 includes other components not discussed above and not shown in FIGS. 1A-1E, such as inner spacers, gate spacers, etch stop layer, contacts, interlayer dielectric layer, some of which will be further discussed below.

As shown in FIGS. 1A-1E, the semiconductor structure 100 includes substrate 102 with circuit region 200 and seal ring 300 thereover. The circuit region 200 includes EPIs 260 which serve as source/drain structures of GAA transistors. The circuit region 200 includes semiconductor layers 210 connecting EPIs 260 and serving as channels of GAA transistors. The circuit region 200 includes gate structures 240 disposed between the EPIs 260 and wrapping around each of the semiconductor layers 210. The seal ring 300 includes multiple EPIs 360, semiconductor layers 310 and 315 alternately stacked one over another, and gate structures 340 over the topmost layer of the semiconductor layers 310 and 315. The semiconductor layers 310 and 315 include different materials or different compositions. In an embodiment, each EPI 360 forms a continuous ring that surrounds the circuit region 200 from a top view. Further, each gate structure 340 also forms a continuous ring that surrounds the circuit region 200 from the top view. The seal ring 300 further includes isolation structures 330 and dummy fins 332 that form continuous rings from a top view, wherein the gate structures 340 and the EPIs 360 are disposed between the isolation structures 330 and dummy fins 332 from a top view. Further, the gate structures 340 do not overlap with the isolation structures 330 or dummy fins 332 from the top view.

Figure 2:
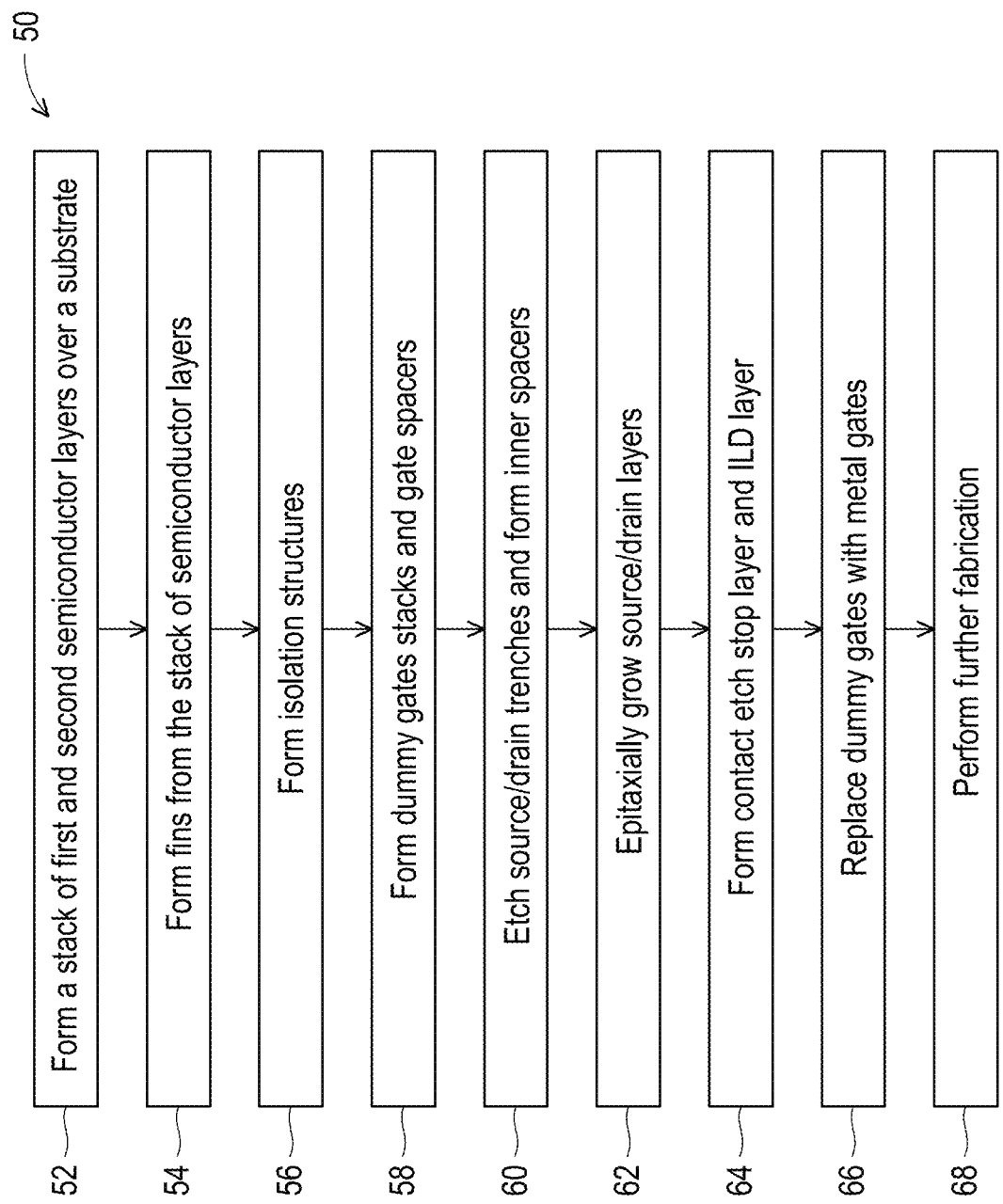
FIG. 2 is a flow chart of a method of making the semiconductor structures in FIGS. 1A, 4A, 5A, 6A, and 7.

FIG. 2 is a flow chart of a method 50 for fabricating the semiconductor structure 100 according to various aspects of the present disclosure. Additional processing is contemplated by the present disclosure. Additional operations can be provided before, during, and after method 50, and some of the operations described can be moved, replaced, or eliminated for additional embodiments of method 50. Method 50 is described below in conjunction with FIGS. 3A-3L that illustrate various cross-sectional views of the semiconductor structure 100 at various steps of fabrication according to the method 50, in accordance with some embodiments.

At operation 52, the method 50 (FIG. 2) forms a stack 205 of semiconductor layers 210 and 215 over a semiconductor layer 204 over a substrate 102 and forms a stack 305 of semiconductor layers 310 and 315 over a semiconductor layer 304 over the substrate 102, such as shown in FIG. 3A according to an embodiment. The stack 205 is formed in the circuit region 200, and the stack 305 is formed in the seal ring 300. The semiconductor layers 310 and 315 are the same as the semiconductor layers 210 and 215, respectively, just in different regions of the semiconductor structure 100. In some embodiments, semiconductor layers 210/310 and semiconductor layers 215/315 are epitaxially grown in the depicted interleaving and alternating configuration. The number of semiconductor layers 210/310 (and the number of semiconductor layers 215/315) may range from 2 to 10 in some embodiments. Semiconductor layers 210/310 and semiconductor layers 215/315 include different materials, constituent atomic percentages, constituent weight percentages, thicknesses, and/or characteristics to achieve desired etching selectivity during an etching process (referred to as channel release process) that will be further discussed.

At operation 54, the method 50 (FIG. 2) forms fins 218 by patterning the stack of semiconductor layers 215/210 and the semiconductor layers 204, and forms fins 318 by patterning the stack of semiconductor layers 315/310 and the semiconductor layers 304. The fins 218 are oriented lengthwise along the "x" direction (see FIG. 1A), which is the direction into and out of the page of FIG. 3B. The fins 318 are formed into rings that surround the circuit region 200. As illustrated in FIG. 3B, the fins 218 include the patterned stack 205 (having semiconductor layers 210 and 215), patterned regions 204, and one or more patterned hard mask layers 206; and the fins 318 include the patterned stack 305 (having semiconductor layers 310 and 315), patterned regions 304, and one or more patterned hard mask layers 206. The fins 218 and 318 may be patterned by any suitable method. For example, the fins 218 and 318 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the stacks 205/305 and patterned using a photolithography process. Spacers are formed alongside the patterned sacrificial layer using a self-aligned process. The sacrificial layer is then removed, and the remaining spacers, or mandrels, may then be used as a masking element for patterning the fins 218/318. For example, the masking element may be used for etching recesses into the stacks 205/305, the semiconductor layers 204/304, and the substrate 102, leaving the fins 218/318 on the substrate 102. The etching process may include dry etching, wet etching, reactive ion etching (RIE), and/or other suitable processes.

At operation 56, the method 50 (FIG. 2) forms isolation structures 230 and dummy fins 232 in the circuit region 200 and forms isolation structures 330 and dummy fins 332 in the seal ring 300. This may involve a variety of processes, such as shown in FIGS. 3C-3E.

Figure 3D:
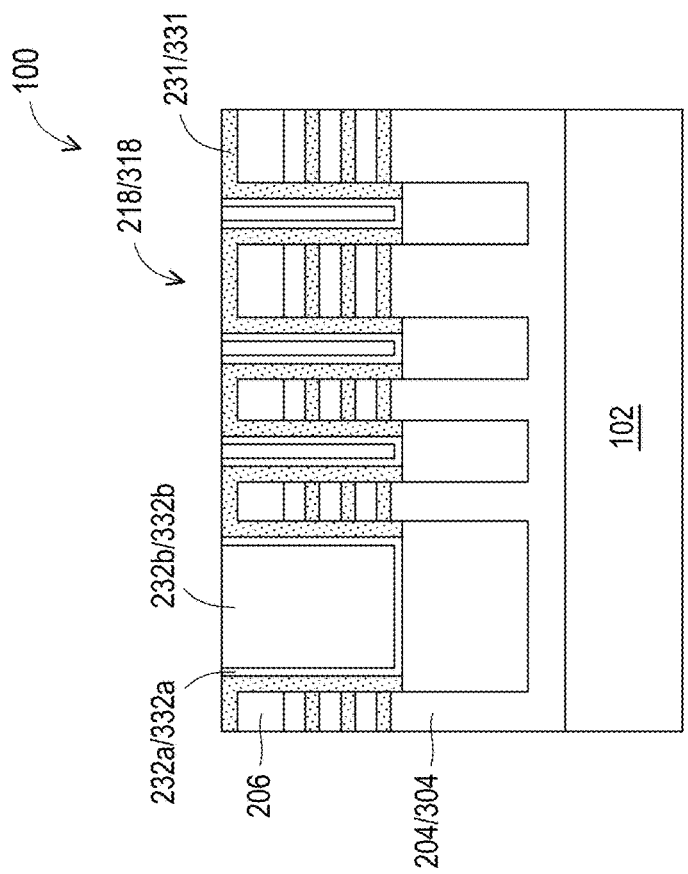
Figure 3C:
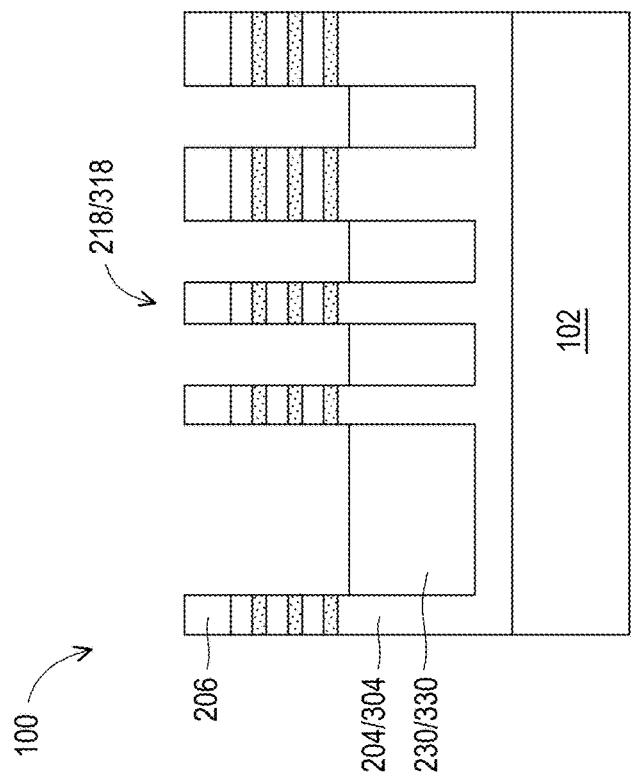

Referring to FIG. 3C, in an embodiment, the isolation structures 230/330 can be formed by filling the trenches between fins 218/318 with insulator material (for example, by using a CVD process or a spin-on glass process), performing a chemical mechanical polishing (CMP) process to remove excessive insulator material and/or planarize a top surface of the insulator material layer, and etching back the insulator material layer to form isolation structures 230/330.

Referring to FIG. 3D, a cladding layer 231 is formed on top and sidewalls of the fins 218, and a cladding layer 331 is formed on top and sidewalls of the fins 318. In an embodiment, the cladding layers 231 and 331 may include the same material and be formed using the same process. For example, the cladding layer 231/331 may include SiGe and may be deposited using CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof. Still referring to FIG. 3D, dielectric layers 232a and 232b are formed in the circuit region 200, and dielectric layers 332a and 332b are formed in the seal ring 300. The dielectric layers 232a and 332a may include the same material and be formed using the same process. The dielectric layers 232b and 332b may include the same material and be formed using the same process. The dielectric layers 232a/332a may be deposited using CVD, PVD, ALD, HDPCVD, MOCVD, RPCVD, PECVD, LPCVD, ALCVD, APCVD, other suitable methods, or combinations thereof. The dielectric layers 232b/332b may be deposited using a flowable CVD (FCVD) process or other types of methods. After the layers 232a/332a and 232b/332b are deposited, the operation 56 may perform a CMP process to planarize the top surface of the semiconductor structure 100 and to expose the cladding layer 231 and 331.

Referring to FIG. 3E, the operation 56 recesses the dielectric layers 232b/332b and 232a/332a using a selective etching process that etches the dielectric layers 232b/332b and 232a/332a with no (or minimal) etching to the hard mask 206 and the cladding layer 231. Then, the operation 56 deposits one or more dielectric materials into the recesses and performs a CMP process to the one or more dielectric materials to form the dielectric layer 232c in the circuit region 200 and the dielectric layer 332c in the seal ring 300. In an embodiment, the dielectric layers 232c/332c include a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), (Ba, Sr)$TiO_3$ (BST), $Si_3N_4$, hafnium dioxide-alumina ($HfO_2$—$Al_2O_3$) alloy, other suitable high-k dielectric material, or combinations thereof.

At operation 58, the method 50 (FIG. 2) forms dummy gate structures 240' in the circuit region 200 and forms dummy gate structures 340' in the seal ring 300. This may involve a variety of processes, such as shown in FIGS. 3F-3G.

Referring to FIG. 3F, operation 58 recesses the fins 218 and 318 (particularly, removing the hard mask layer 206) and the cladding layer 231 and 331 that are disposed between the dielectric layers 232c and 332c, respectively. Then, operation 58 deposits a dielectric layer 235 in the circuit region 200 and a dielectric layer 335 in the seal ring 300. The dielectric layers 235 and 335 may include the same material and be formed using the same process. In the present embodiment, dielectric layers 235/335 are dummy (or sacrificial) gate dielectric layers and may include silicon oxide, a high-k dielectric material, other suitable dielectric material, or combinations thereof. Dielectric layers 235/335 may be deposited using any of the processes described herein, such as ALD, CVD, PVD, other suitable process, or combinations thereof.

Figure 3G:
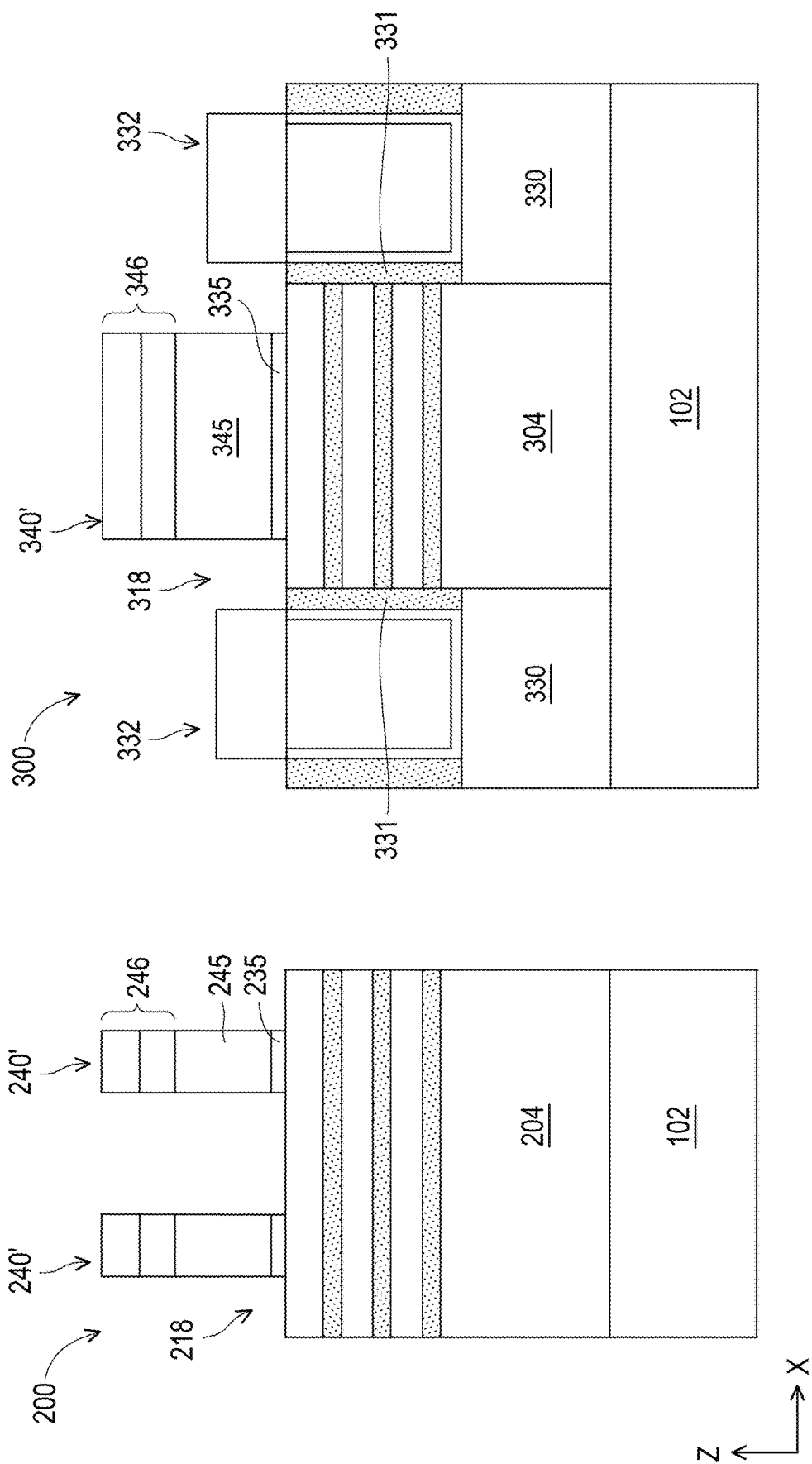

Referring to FIG. 3G, operation 58 deposits a dummy gate layer 245 over the dummy gate dielectric layer 235 in the circuit region 200 and deposits a dummy gate layer 345 over the dielectric layer 335 in the seal ring 300. The dummy gate layers 245 and 345 may include the same material and be formed using the same process. In an embodiment, dummy gate layers 245 and 345 include polysilicon (or poly). Then, operation 58 forms a hard mask layer 246 in the circuit region 200 and a hard mask layer 346 in the seal ring 300. The hard mask layers 246 and 346 may include the same material and be formed using the same process. Then, operation 58 performs lithography patterning and etching processes to pattern the hard mask layers 246/346, the dummy gate layers 245/345, and the dummy gate dielectric layers 235/335 to form dummy gate structures 240' in the circuit region 200 and dummy gate structures 340' in the seal ring 300. Dummy gate structure 240' includes portions of the hard mask layer 246, portions of the dummy gate layer 245, and portions of the dummy gate dielectric layer 235. Dummy gate structure 340' includes portions of the hard mask layer 346, portions of the dummy gate layer 345, and portions of the dummy gate dielectric layer 335. Dummy gate structures 240' are formed into lines that are oriented lengthwise along the "y" direction (see FIG. 1A), which is the direction into and out of the page of FIG. 3G. In other words, the dummy gate structures 240' are formed to traverse (or be perpendicular to) the fins 218 from the top view. Dummy gate structures 340' are formed into rings that surround the circuit region 200 from a top view (see FIG. 1A). Particularly, each dummy gate structure 340' is formed to be narrower than the underlying fin 318 and does not extend to the dummy fins 332 on both sides of the fin 318.

Figure 3H:
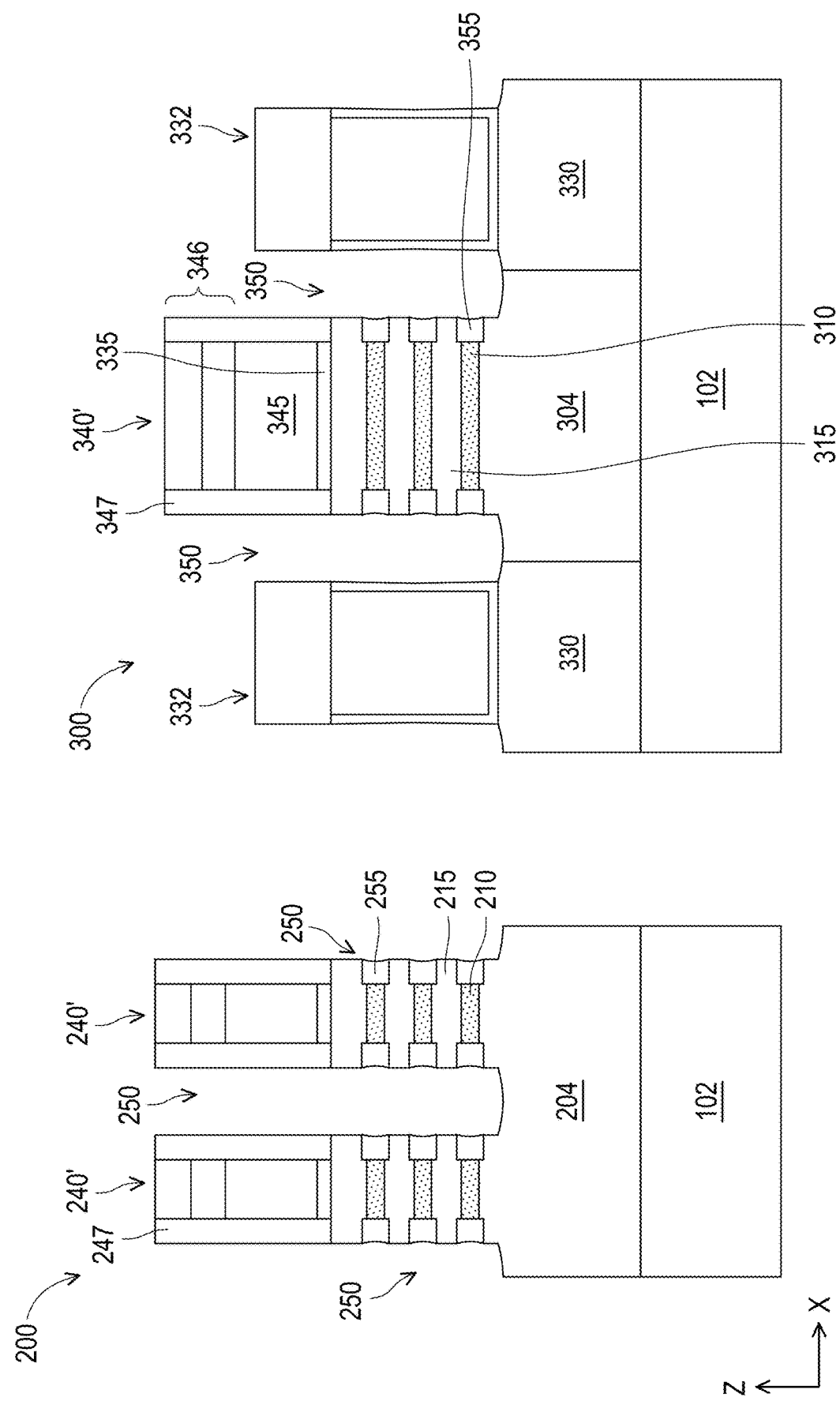

Operation 58 may further form gate spacers 247 on sidewalls of dummy gate structures 240' and gate spacers 347 on sidewalls of dummy gate structures 340' (as shown in FIG. 3H). Gate spacers 247 and 347 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate structures 240' and 340' and subsequently etched (e.g., anisotropically etched) to form gate spacers 247 and 347. In some embodiments, gate spacers 247 and 347 include a multi-layer structure, such as a first dielectric layer that includes silicon nitride and a second dielectric layer that includes silicon oxide.

At operation 60, the method 50 (FIG. 2) forms source/drain (S/D) trenches 250 by etching the fins 218 adjacent the gate spacers 247 and forms source/drain (S/D) trenches 350 by etching the fins 318 adjacent the gate spacers 347, such as shown in FIG. 3H. For example, one or more etching processes are used to remove semiconductor layers 210 and 215 in source/drain regions of fins 218 and to remove semiconductor layers 310 and 315 in certain regions of fins 318. The etching of the semiconductor layers 310 and 315 are self-aligned to the dummy fins 332, gate spacers 347, and dummy gate structures 340'. In some embodiments, the etching process removes some, but not all, of semiconductor layers 210, 215, 310, and 315. The etching process can include a dry etching process, a wet etching process, other suitable etching process, or combinations thereof.

Operation 60 further forms inner spacers 255 in the circuit region 200 and inner spacers 355 in seal ring 300, such as shown in FIG. 3H. For example, a first etching process is performed that selectively etches semiconductor layers 210 exposed by source/drain trenches 250 with minimal (to no) etching of semiconductor layers 215, such that gaps are formed between semiconductor layers 215 and between semiconductor layers 215 and semiconductor layer 204 under gate spacers 247. At the same time, the first etching process selectively etches semiconductor layers 310 exposed by trenches 350 with minimal (to no) etching of semiconductor layers 315, such that gaps are formed between semiconductor layers 315 and between semiconductor layers 315 and semiconductor layer 304 under gate spacers 347. The first etching process is configured to laterally etch (e.g., along the "x" direction) semiconductor layers 210/310, thereby reducing a length of semiconductor layers 210/310 along the "x" direction. The first etching process is a dry etching process, a wet etching process, other suitable etching process, or combinations thereof. A deposition process then forms a spacer layer in the trenches 250/350. The deposition process is configured to ensure that the spacer layer fills the gaps discussed above. A second etching process is then performed that selectively etches the spacer layer to form inner spacers 255 and 355 as depicted in FIG. 3H with minimal (to no) etching of other material layers. In some embodiments, the spacer layer 255/355 includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the spacer layer 255/355 includes a low-k dielectric material, such as those described herein.

Figure 3I:
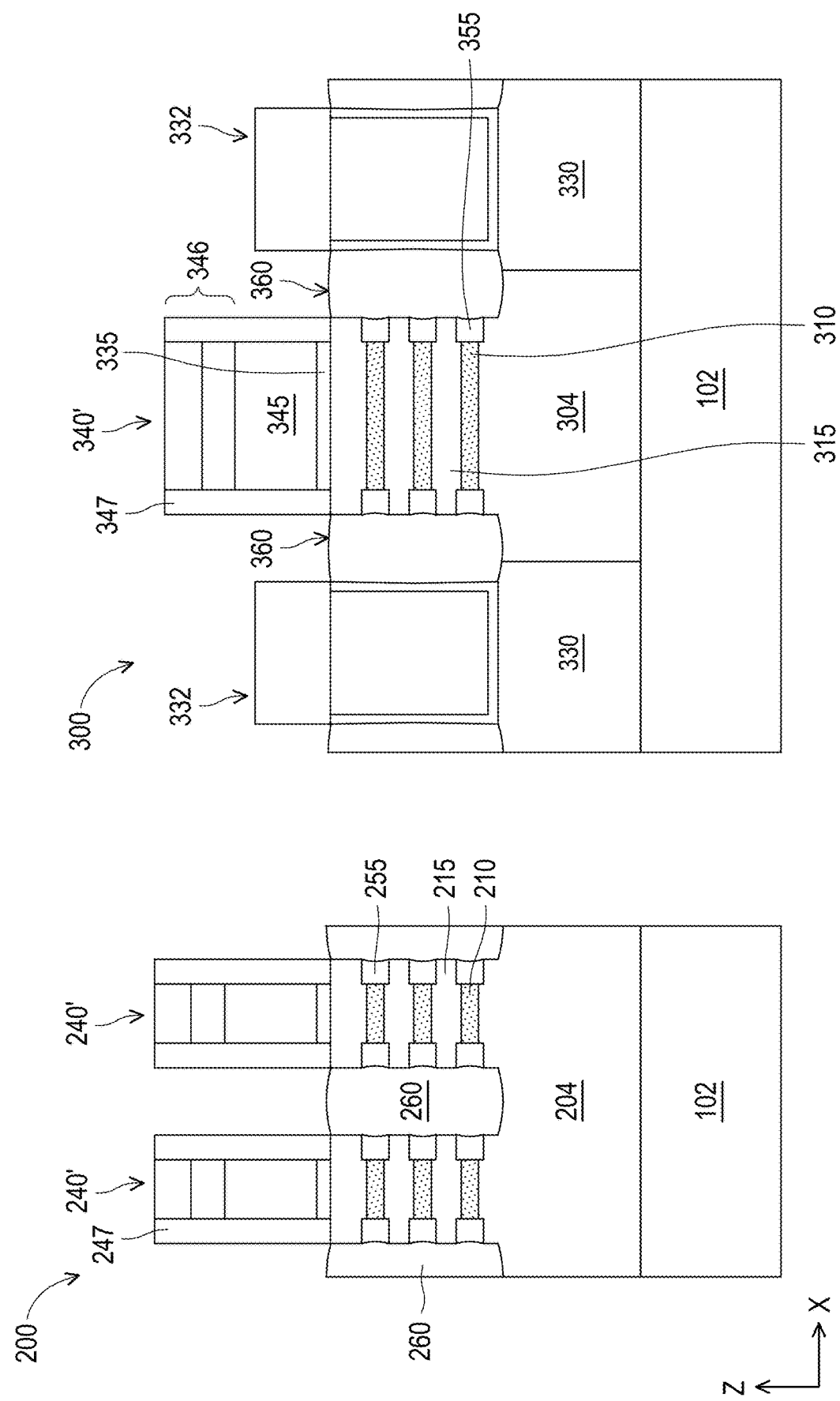

At operation 62, the method 50 (FIG. 2) epitaxially grows semiconductor layers 260 in the S/D trenches 250 and epitaxially grows semiconductor layers 360 in the trenches 350, such as shown in FIG. 3I. The semiconductor layers 260 and 360 are also referred to as EPIs 260 and 360, respectively. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of the semiconductor layers 204, 215, 304, and 315. EPIs 260 and 360 may be doped with n-type dopants or p-type dopants for n-type transistors or p-type transistors respectively. In some embodiments, EPIs 260 and 360 may include silicon and can be doped with carbon, phosphorous, arsenic, other n-type dopant, or combinations thereof. In some embodiments, EPIs 260 and 360 may include silicon germanium or germanium and can be doped with boron, other p-type dopant, or combinations thereof. In some embodiments, EPIs 260 and 360 include more than one epitaxial semiconductor layer.

Figure 3J:
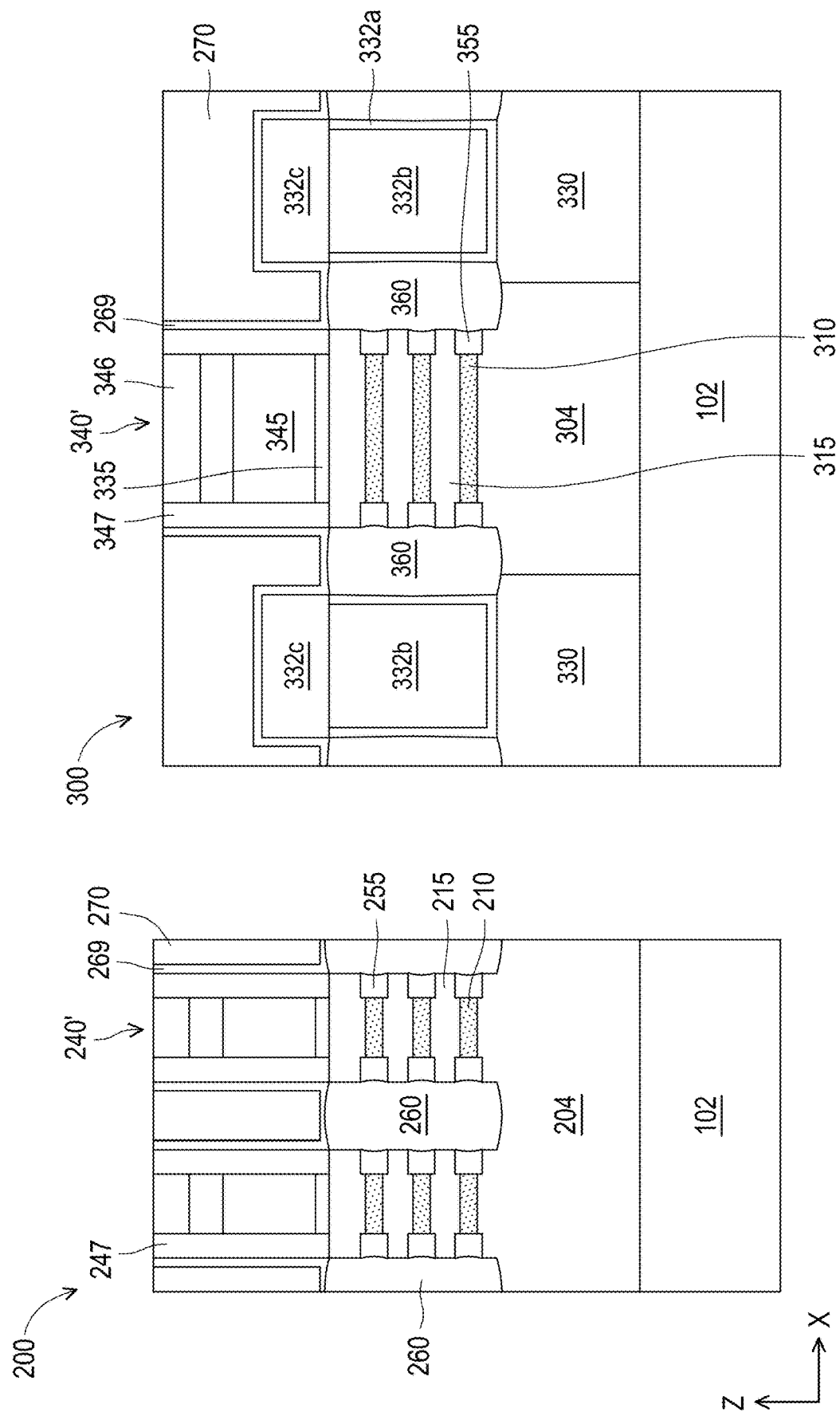

At operation 64, the method 50 (FIG. 2) forms a contact etch stop layer (CESL) 269 and an inter-layer dielectric (ILD) layer 270, such as shown in FIG. 3J. The CESL 269 is deposited over the dummy fins 232, 332 and EPIs 260, 360, and on sidewalls of the gate spacers 247 and 347. The ILD layer 270 is deposited over the CESL 269 and fills the space between opposing gate spacers 247/347. The CESL 269 includes a material that is different than ILD layer 270 and different than the dielectric layer 232c/332c. The CESL 269 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 270 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 270 may be formed by PECVD (plasma enhanced CVD), FCVD (flowable CVD), or other suitable methods. Subsequent to the deposition of the CESL 269 and the ILD layer 270, a CMP process and/or other planarization process can be performed until reaching (exposing) a top portion (or top surface) of dummy gate structures 240', 340'. In some embodiments, the planarization process removes hard mask layers 246, 346 of dummy gate structures 240', 340' to expose underlying dummy gate layers 245, 345.

Figure 3K:
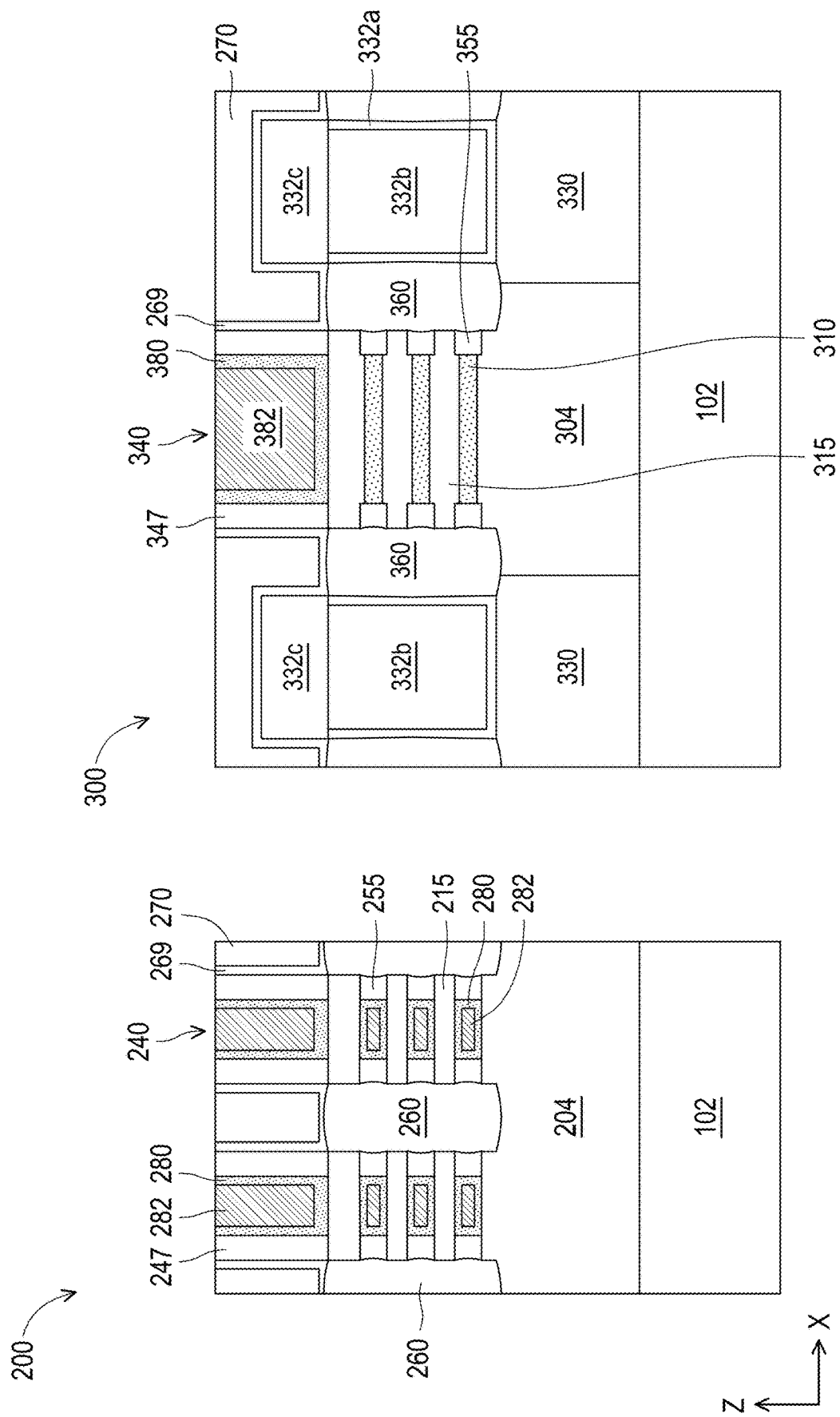

At operation 66, the method 50 (FIG. 2) replaces dummy gate structures 240' with functional gate structure 240 (such as high-k metal gates) and replaces dummy gate structures 340' with functional gate structure 340 (such as high-k metal gates), such as shown in FIG. 3K. This involves a variety of processes as briefly described below.

First, the operation 66 removes dummy gate structures 240' and 340' using one or more etching process, which forms gate trenches in circuit region 200 and in seal ring 300. The etching process may be a dry etching process, a wet etching process, other suitable etching process, or combinations thereof. The etching process is configured to selectively etch dummy gate structures 240'/340' with minimal (to no) etching of other structures, such as ILD layer 270, gate spacers 247/347, isolation structures 230/330, dummy fins 232/332, cladding layers 231/331, semiconductor layers 215/315, and semiconductor layers 210/310.

Next, the operation 66 removes the cladding layer 231 exposed in the gate trenches in circuit region 200. The etching process may selectively etch the cladding layer 231 with minimal (to no) etching of semiconductor layers 215/315, gate spacers 247/347, and inner spacers 255. As a result, the semiconductor layers 210 are exposed in the gate trenches in circuit region 200. In the seal ring 300, the cladding layer 331 during the operation 60. The topmost layer of the semiconductor layers 315 protects the underlying layers, particularly the semiconductor layers 310, from this etching process.

Next, the operation 66 removes the semiconductor layers 210 exposed in the gate trenches, leaving the semiconductor layers 215 suspended over the semiconductor layer 204 and connected with the EPIs 260. This process is also referred to as a channel release process and the semiconductor layers 215 are also referred to as channel layers. The etching process selectively etches semiconductor layers 210 with minimal (to no) etching of semiconductor layers 215 and, in some embodiments, minimal (to no) etching of gate spacers 247 and/or inner spacers 255. In the seal ring 300, the topmost layer of the semiconductor layers 315 protects the underlying layers, particularly the semiconductor layers 310, from this etching process. Thus, there is no channel release in the seal ring 300.

Next, the operation 66 forms a gate dielectric layer 280 that wraps around each of the semiconductor layers 215 and forms a gate electrode 282 over the gate dielectric layer 280. The functional gate structure 240 comprises the gate dielectric layer 280 and the gate electrode 282. Similarly, operation 66 forms a gate dielectric layer 380 over the topmost layer of the semiconductor layers 315 and forms a gate electrode 382 over the gate dielectric layer 380. The gate structure 340 comprises the gate dielectric layer 380 and the gate electrode 382. The gate dielectric layers 280 and 380 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. The gate dielectric layers 280 and 380 may be formed by chemical oxidation, thermal oxidation, atomic layer deposition (ALD), chemical vapor deposition (CVD), and/or other suitable methods. In some embodiments, the gate structures 240/340 further includes an interfacial layer between the gate dielectric layer 280/380 and the semiconductor layers 215/315. The interfacial layer may include silicon dioxide, silicon oxynitride, or other suitable materials. In some embodiments, the gate electrode 282 includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. In embodiments, the gate electrode 382 does not include a work function layer as there are no functioning transistors in the seal ring. For example, the gate electrode 382 may include aluminum, tungsten, cobalt, copper, and/or other suitable materials. Various layers of the gate electrodes 282 and 382 may be formed by CVD, PVD, plating, and/or other suitable processes. Since the gate structures 240 and 340 include a high-k dielectric layer and metal layer(s), they are also referred to as high-k metal gates.

Figure 3L:
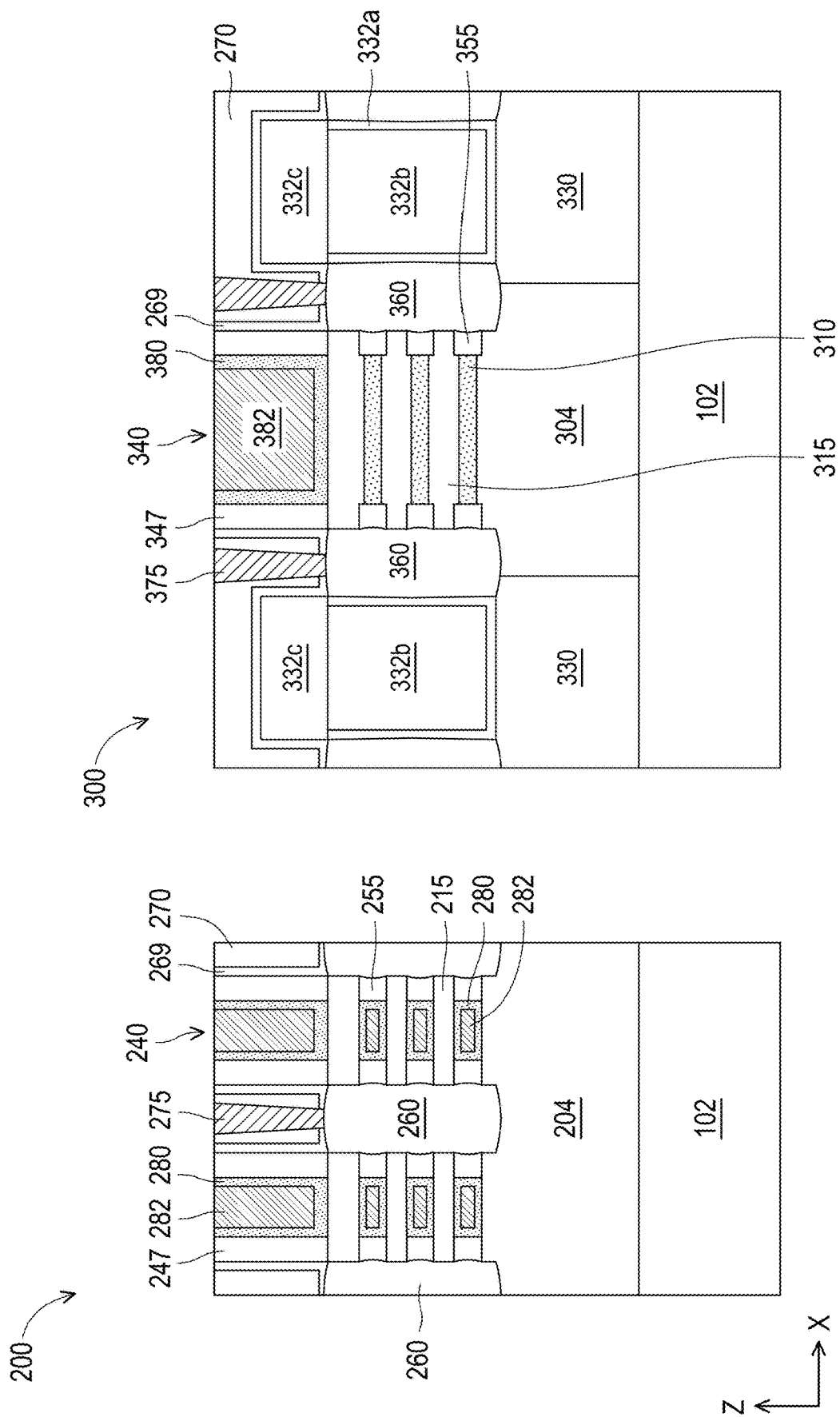

At operation 68, the method 50 (FIG. 2) performs further fabrications. For example, the method 50 etches contact holes to expose some of the EPIs 260 and 360 and forms contacts 275 to electrically connected to EPIs 260 and forms contacts 375 to electrically connected to EPIs 360, such as shown in FIG. 3L. The method 50 may form silicide layer(s) (not shown) between contacts 275 and EPIs 260 and between contacts 375 and EPIs 360. The silicide layer(s) may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. The contacts 275 and 375 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. The method 50 may perform mid-end-of-line (MEOL) processes and back-end-of-line (BEOL) processes. For example, the method 50 may form gate vias connecting to the gate structures 240/340, form contact vias connecting to the contacts 275/375, and form one or more interconnect layers with wires and vias embedded in dielectric layers. The one or more interconnect layers connect gate, source, and drain electrodes of various transistors, as well as other circuits in the circuit region 200, to form an integrated circuit in part or in whole. The one or more interconnect layers also form part of the seal ring 300. The method 50 may also form passivation layer(s) over the interconnect layers.

Figure 4A:
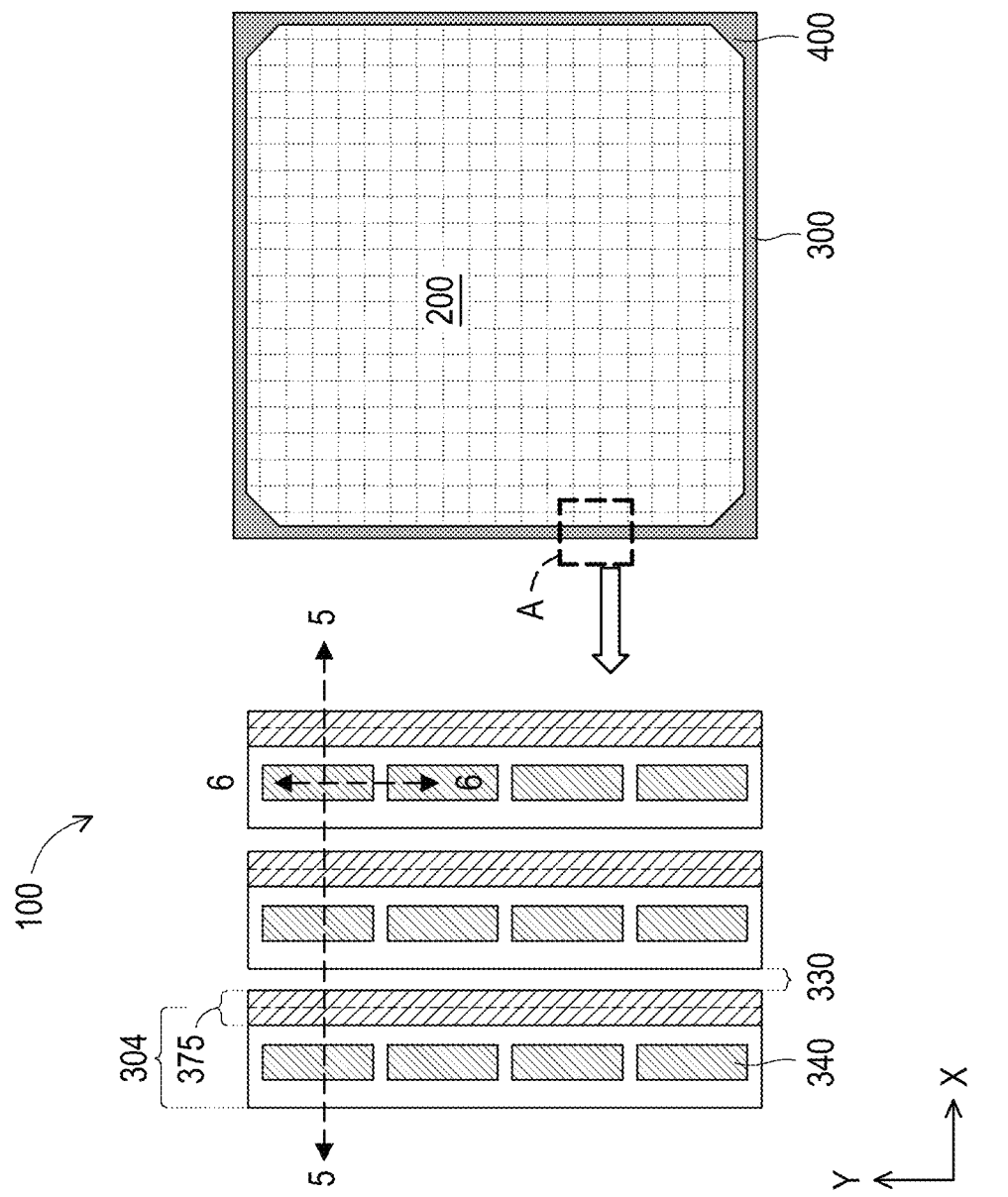
FIG. 4A is a top plan view of a semiconductor structure with a seal ring according to aspects of the present disclosure.
Figure 4B:
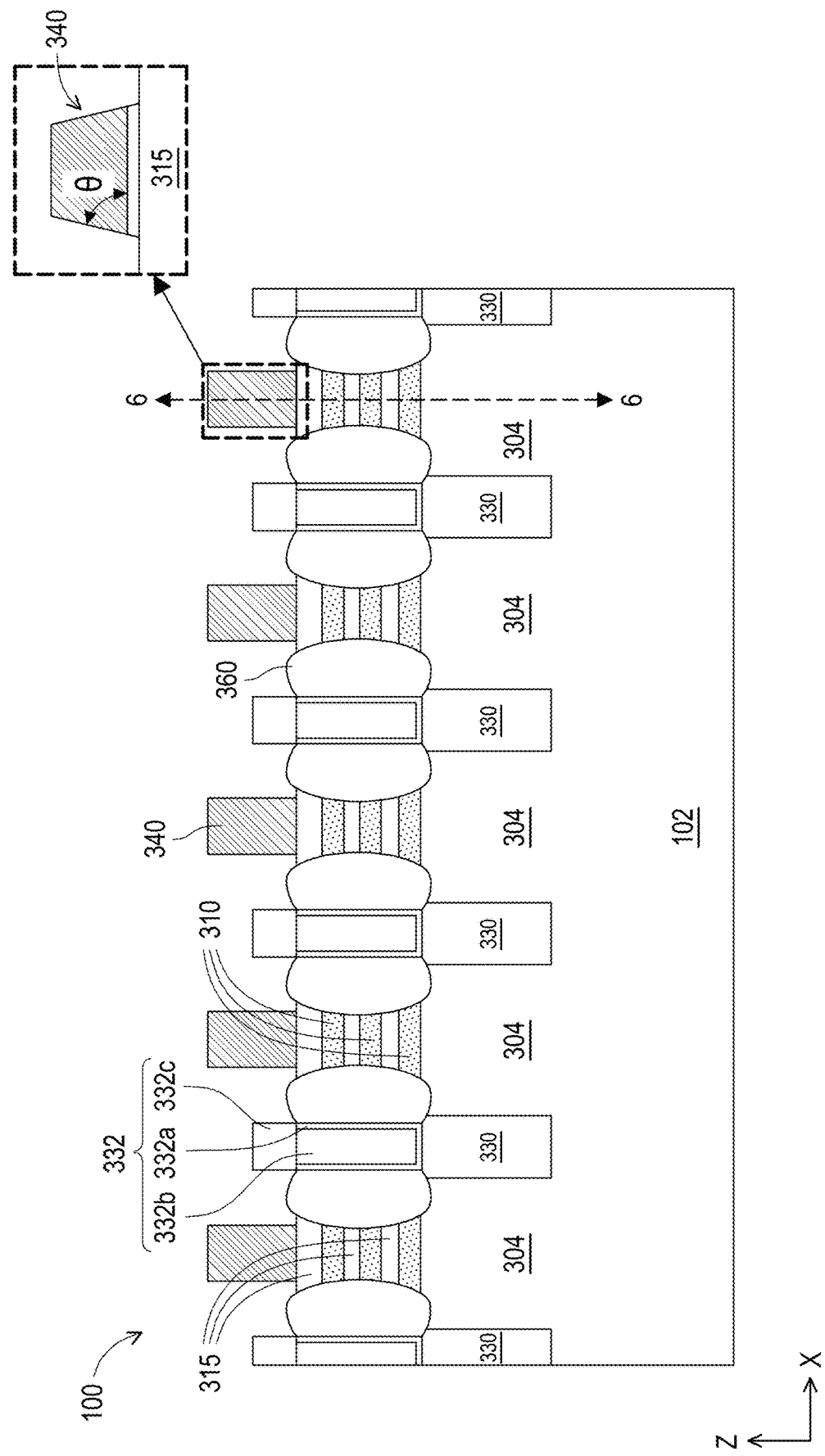
FIGS. 4B and 4C are cross-sectional views of the semiconductor structure in FIG. 4A along the "5-5" and "6-6" lines in FIG. 4A, respectively, according to aspects of the present disclosure.
Figure 4C:
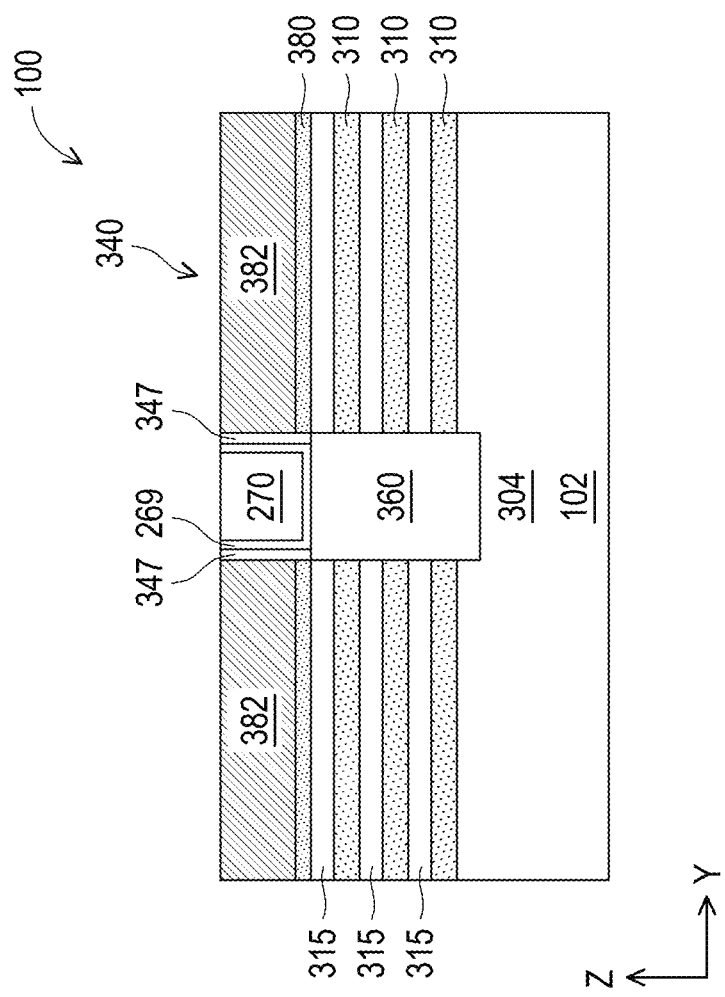

FIG. 4A is a top plan view of the semiconductor structure 100 according to another embodiment of the present disclosure. FIGS. 4B and 4C are cross-sectional views of a portion of the semiconductor structure 100 along the "5-5" and "6-6" lines in FIG. 4A, respectively, according to aspects of the present disclosure. The circuit region 200 in this embodiment is the same as the circuit region 200 in the embodiment shown in FIG. 1A. The seal ring 300 in this embodiment is similar to the seal ring 300 in the embodiment shown in FIG. 1A with some differences discussed below.

In the embodiment depicted in FIGS. 4A-4C, gate structures 340 are segments that form discrete rings surrounding the circuit region 200, rather than continuous rings as in the embodiment of FIGS. 1A-1E. Gate structures 340 are separate one from another along both the "x" and the "y" directions. Gate structures 340 are narrower than the underlying semiconductor layer 304 from a top view. Further, EPIs 360 are formed to surround each gate structure 340 from a top view. The seal ring 300 shown in FIG. 4B is the same as the seal ring 300 shown FIG. 1B. The seal ring 300 shown in FIG. 4C is similar to the seal ring 300 shown FIG. 1C with some differences. In the embodiment depicted in FIG. 4C, EPI 360 is formed between gate structures 340 of the same discrete ring. Other features of the semiconductor structure 100 in this embodiment are the same as the embodiment shown in FIGS. 1A-1E.

The semiconductor structure 100 shown in FIGS. 4A-4C may be formed by an embodiment of the method 50. For example, during operation 58, dummy gate structures 340' are formed as segments of discrete rings surrounding the circuit region 200, and gate spacers 347 are formed on all four sidewalls of the dummy gate structures 340'. Then, during operation 60, trenches are etched into the stacks 305 and self-aligned to the dummy gate structures 340' and gate spacers 347. Other operations of the method 50 may be the same as those discussed above with reference to FIGS. 2 and 3A-3L.

Figure 5A:
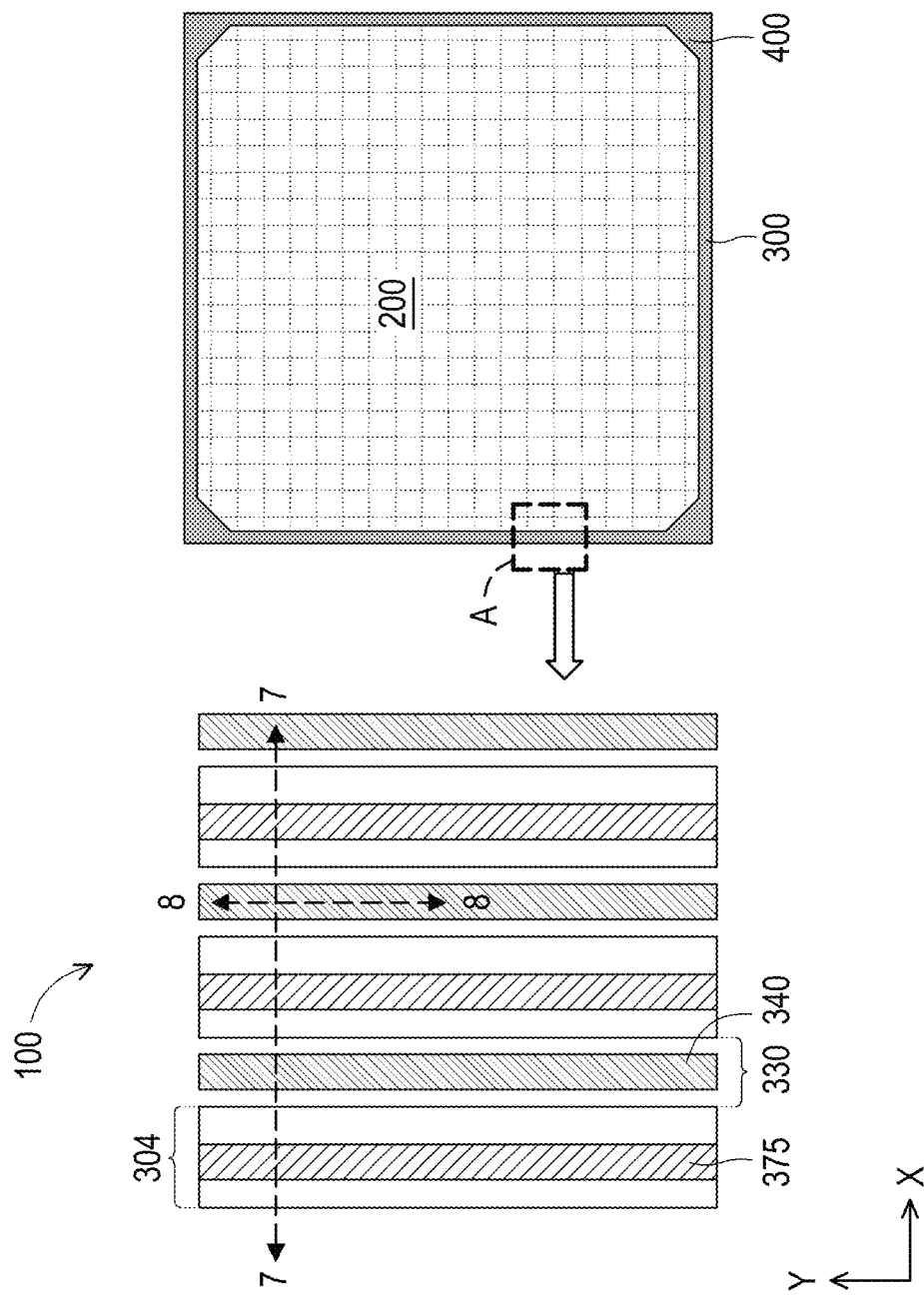
FIG. 5A is a top plan view of a semiconductor structure with a seal ring according to aspects of the present disclosure.
Figure 5B:
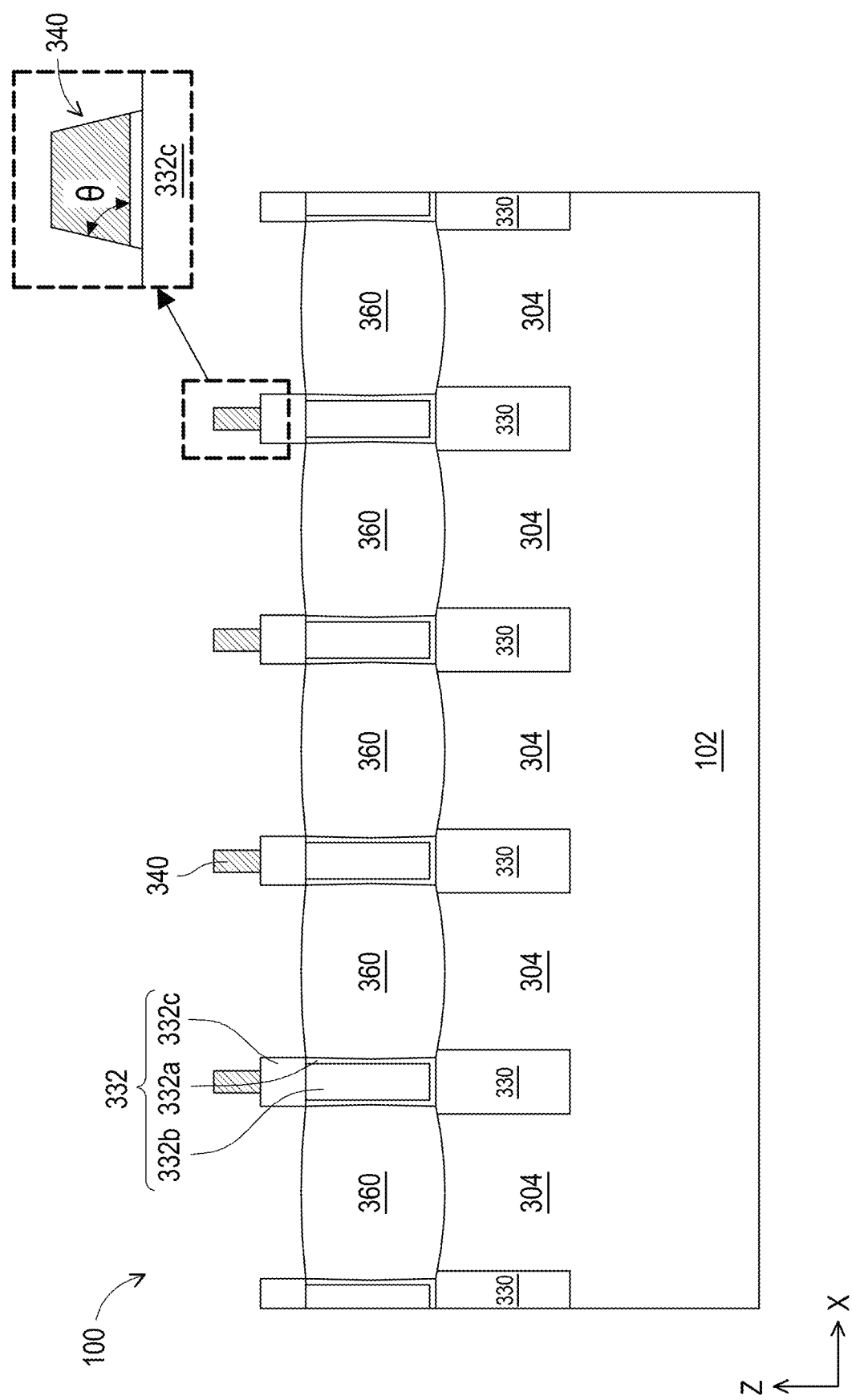
FIGS. 5B and 5C are cross-sectional views of the semiconductor structure in FIG. 5A along the "7-7" and "8-8" lines in FIG. 5A, respectively, according to aspects of the present disclosure.
Figure 5C:
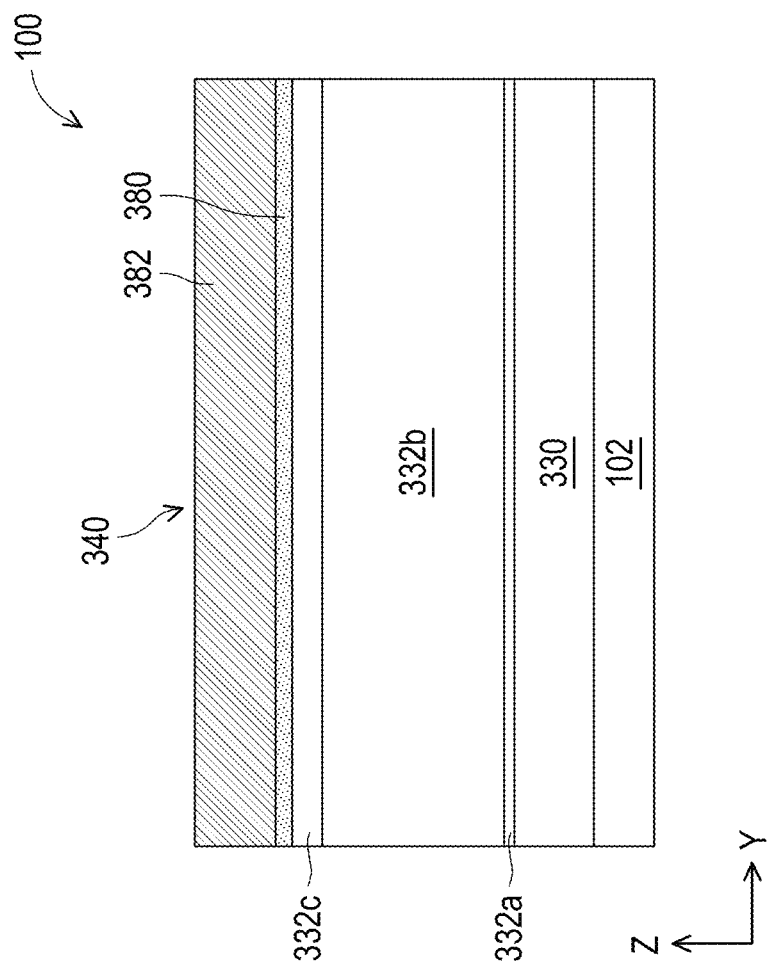

FIG. 5A is a top plan view of the semiconductor structure 100 according to another embodiment of the present disclosure. FIGS. 5B and 5C are cross-sectional views of a portion of the semiconductor structure 100 along the "7-7" and "8-8" lines in FIG. 5A, respectively, according to aspects of the present disclosure. The circuit region 200 in this embodiment is the same as the circuit region 200 in the embodiment shown in FIG. 1A. The seal ring 300 in this embodiment is similar to the seal ring 300 in the embodiment shown in FIG. 1A with some differences discussed below.

In the embodiment depicted in FIGS. 5A-5C, gate structures 340 are continuous rings as in the embodiment of FIGS. 1A-1E. However, gate structures 340 are disposed directly over the dummy fins 332. From the top view, gate structures 340 are narrower than the dummy fins 332 and do not extend to the semiconductor layers 304. Further, semiconductor layers 315 and 310 are removed from seal ring 300. EPIs 360 completely fill the space laterally between dummy fins 332 and above the semiconductor layer 304. Gate structure 340 may have a tapered profile (i.e., having tapered sidewalls) where its sidewall may form an angle θ with the top surface of the dielectric layer 332c. In some embodiment, the angle θ may be in a range of about 88 degrees to about 90 degrees.

The semiconductor structure 100 shown in FIGS. 5A-5C may be formed by an embodiment of the method 50. For example, during operation 58, dummy gate structures 340' are formed directly above the dummy fins 332 and gate spacers 347 are formed on sidewalls of the dummy gate structures 340'. Then, during operation 60, trenches are etched into the stacks 305 and self-aligned to the dummy gate structures 340' and gate spacers 347. Since the stacks 305 are not protected by dummy gate structures 340', they are completely removed during operation 60. Other operations of the method 50 may be the same as those discussed above with reference to FIGS. 2 and 3A-3L.

Figure 6A:
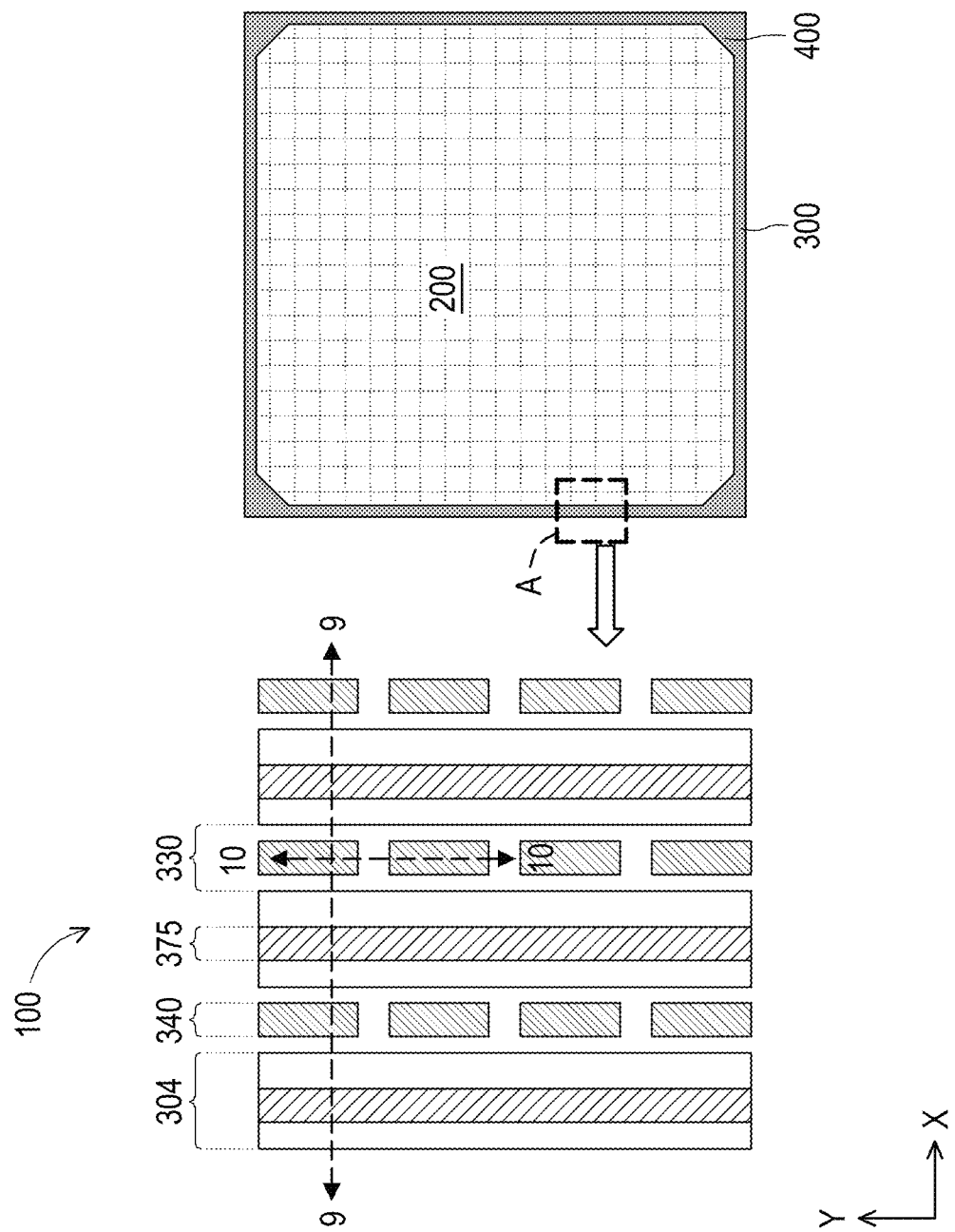
FIG. 6A is a top plan view of a semiconductor structure with a seal ring according to aspects of the present disclosure.
Figure 6B:
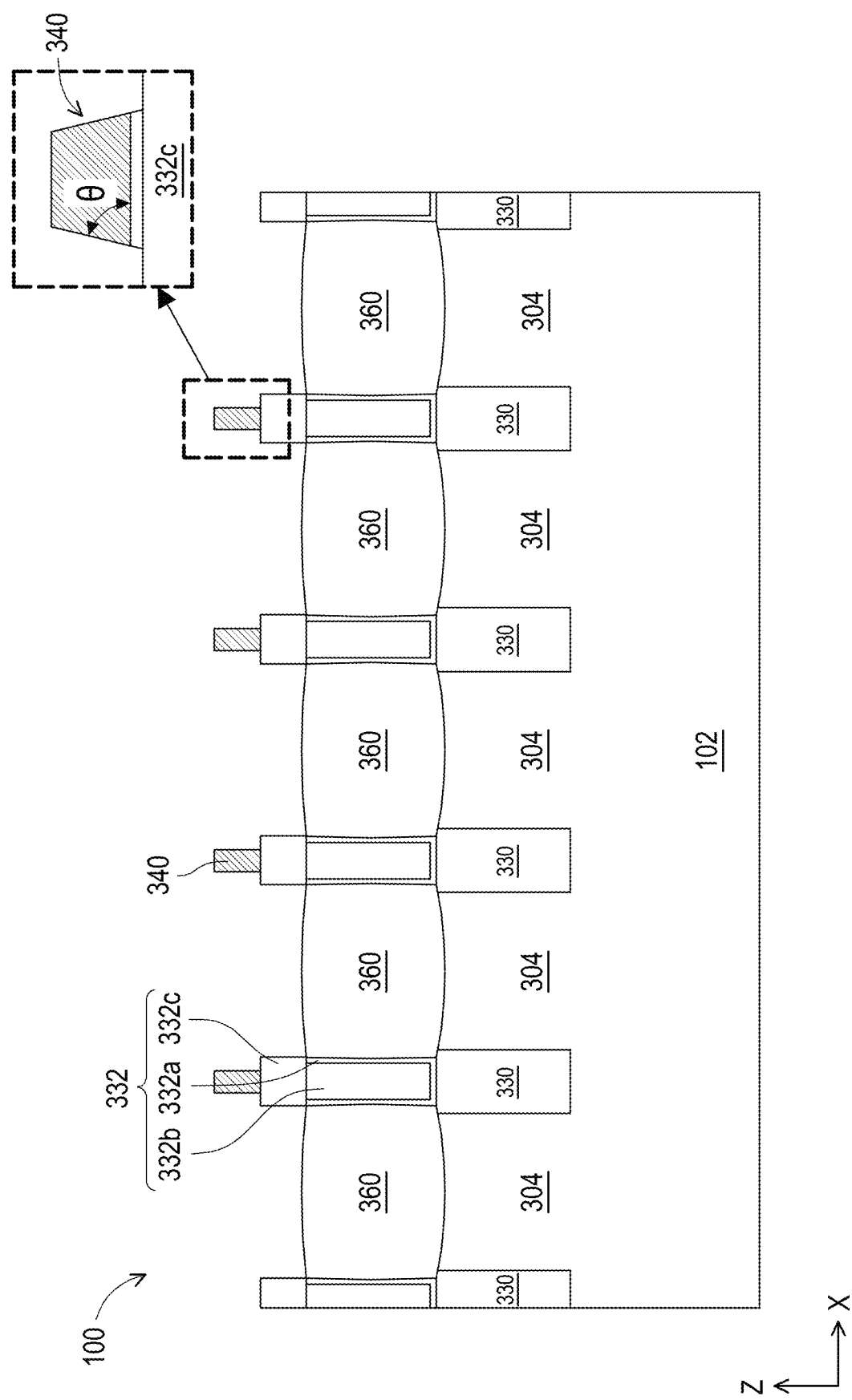
FIGS. 6B and 6C are cross-sectional views of the semiconductor structure in FIG. 6A along the "9-9" and "10-10" lines in FIG. 6A, respectively, according to aspects of the present disclosure.
Figure 6C:
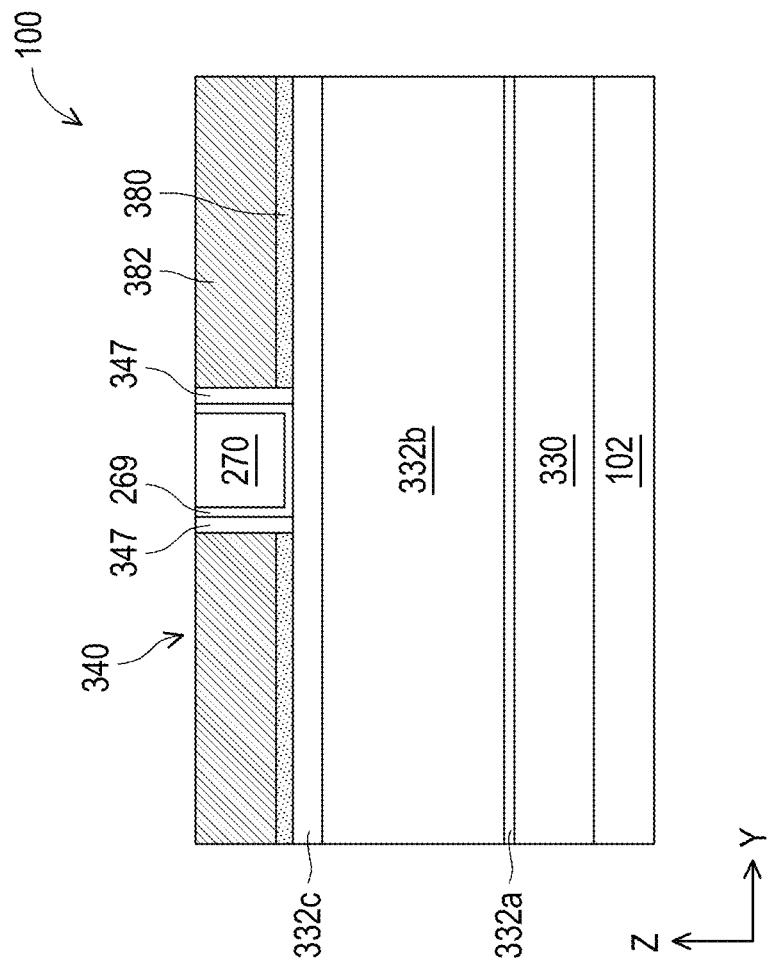

FIG. 6A is a top plan view of a semiconductor structure (or semiconductor device) 100 according to another embodiment of the present disclosure. FIGS. 6B and 6C are cross-sectional views of a portion of the semiconductor structure 100 along the "9-9" and "10-10" lines in FIG. 6A, respectively, according to aspects of the present disclosure. The circuit region 200 in this embodiment is the same as the circuit region 200 in the embodiment shown in FIG. 5A. The seal ring 300 in this embodiment is similar to the seal ring 300 in the embodiment shown in FIG. 5A with some differences discussed below.

In the embodiment depicted in FIGS. 6A-6C, gate structures 340 are segments that form discrete rings surrounding the circuit region 200, rather than continuous rings as in the embodiment of FIGS. 5A-5C. Gate structures 340 are separate one from another along both the "x" and the "y" directions. Gate structures 340 are disposed directly above the dummy fins 332 and are narrower than the underlying dummy fins 332 from a top view. Other features of the semiconductor structure 100 in this embodiment are the same as the embodiment shown in FIGS. 5A-5C.

The semiconductor structure 100 shown in FIGS. 6A-6C may be formed by an embodiment of the method 50. For example, during operation 58, dummy gate structures 340' are formed as segments of discrete rings surrounding the circuit region 200 and are disposed directly above the dummy fins 332, and gate spacers 347 are formed on all four sidewalls of the dummy gate structures 340'. Then, during operation 60, trenches are etched into the stacks 305 and self-aligned to the dummy gate structures 340' and gate spacers 347. Since the stacks 305 are not protected by dummy gate structures 340', they are completely removed during operation 60. Other operations of the method 50 may be the same as those discussed above with reference to FIGS. 2 and 3A-3L.

Figure 7:
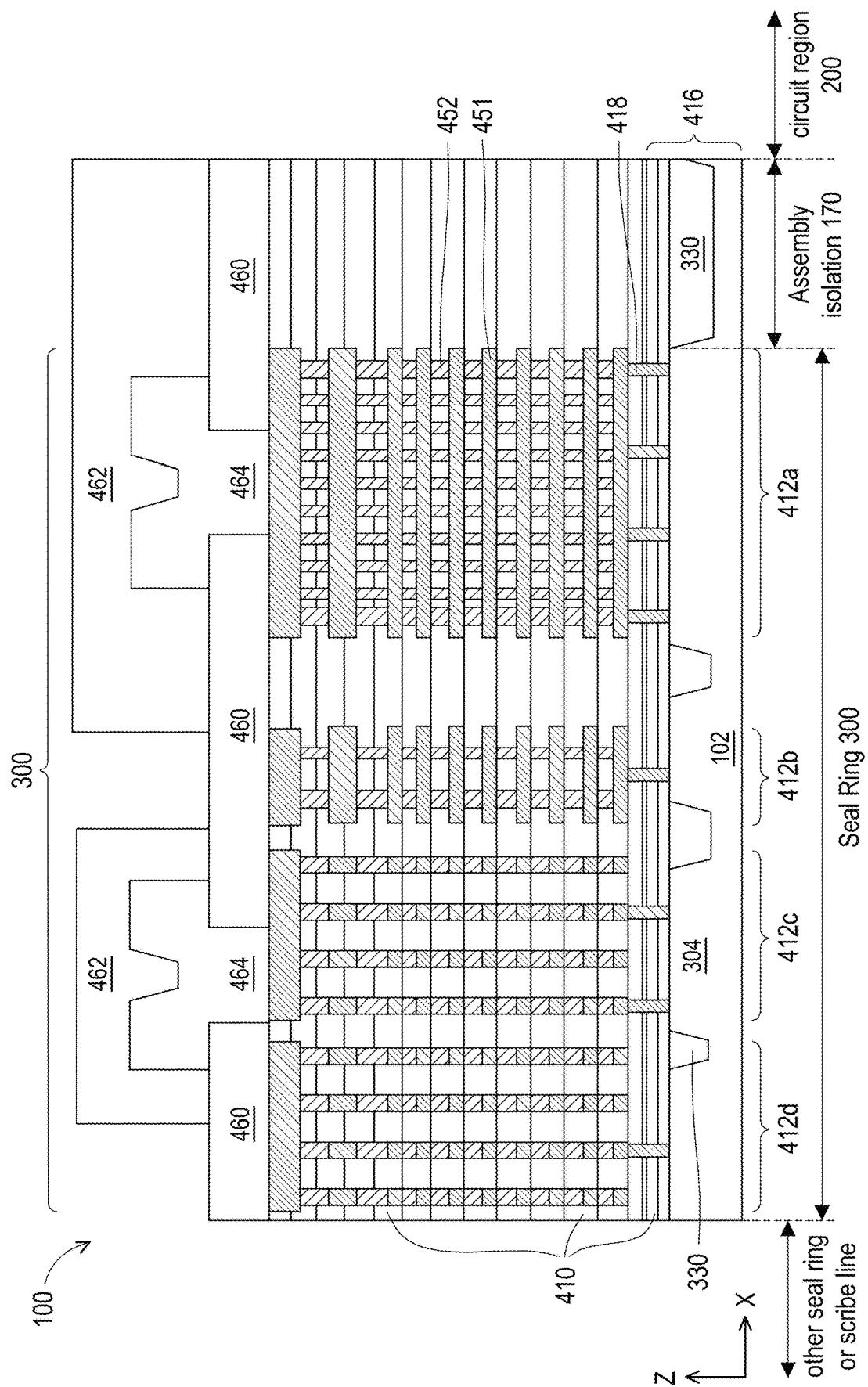
FIG. 7 shows a cross-sectional view of various layers of the semiconductor structure shown in FIGS. 1A, 4A, 5A, and 6A, according to an embodiment of the present disclosure.

FIG. 7 illustrates a cross-section of the semiconductor structure 100 in the area A in FIGS. 1A, 4A, 5A, and 6A according to an embodiment. The seal ring 300 includes sub seal rings 412a, 412b, 412c, and 412d. The embodiments shown in FIGS. 1A-1E, 4A-4C, 5A-5C, and 6A-6C may be implemented in the layers denoted 416, including the stacks 305 of semiconductor layers 315 and 310, EPIs 360, dummy fins 332, gate structures 340, and so on.

Each of the sub seal rings 412a, 412b, 412c, and 412d includes one or more conductive features 418. The conductive features 418 may include multiple conductors vertically connected, and may include doped semiconductors, metals, conductive nitride, conductive oxide, or other types of conductive materials. For example, conductive features 418 may include EPIs 360, contacts 375, gate vias, and so on. Over the conductive features 418, each of the sub seal rings 212a, 212b, 212c, and 212d further includes multiple metal layers 451 stacked one over another and vertically connected by metal vias 452. Metal layers 451 and metal vias 452 may comprise copper, copper alloys, or other conductive materials and may be formed using damascene or dual damascene processes. Each of the metal layers 451 and the metal vias 452 may include a conductive barrier layer (such as TiN or TaN) surrounding a metal core (such as copper). In an embodiment, each of the metal layers 451 is formed into a ring or a ring-like structure (such as a substantially square ring) that surrounds the circuit region 200. In the present embodiment, each of the sub seal rings 412a and 412c further includes an aluminum pad 464.

The conductive features 418, the metal layers 451, and the metal vias 452 are embedded in dielectric layers 410. The dielectric layers 410 may include silicon oxide, silicon nitride, silicon oxynitride, low-k dielectric materials, extreme low-k (ELK) dielectric materials, or other suitable dielectric materials (for example, including silicon, oxygen, nitrogen, carbon, or other suitable isolation constituent), or combinations thereof. The semiconductor structure 100 further includes a passivation layer 460 over the dielectric layers 410 and another passivation layer 462 over the passivation layer 460. Each of the aluminum pads 464 includes a top portion that is disposed over the passivation layer 460 and a bottom portion that penetrates the passivation layer 460 and electrically connects to the sub seal rings 412a and 412c. In an embodiment, each of the aluminum pads 464 is formed into a shape of a ring that surrounds the circuit region 200. Aluminum pads 464 may be formed simultaneously with the formation of bond pads (not shown) that are exposed on the top surface of circuit region 200. The passivation layer 462 is disposed over the passivation layer 460 and the aluminum pads 464. Passivation layers 460 and 462 may be formed of oxides, nitrides, and combinations thereof, and may be formed of the same or different materials. Each of the sub seal rings 412a-d is in the form a vertical wall extending from the substrate 102 to the upper metal layer 451 and the aluminum pad 464.

The semiconductor structure 100 further includes an assembly isolation 170 between the seal ring 300 and the circuit region 200. The assembly isolation 170 includes the isolation structure (such as shallow trench isolation) 330. In some embodiments, the semiconductor structure 100 may include various dummy lines and dummy vias in the assembly isolation 170. Outside of the seal ring 300, the semiconductor structure 100 may include other seal ring(s) that are the same as or similar to the structure of the seal ring 300 in an embodiment. Alternatively or additionally, the semiconductor structure 100 may include scribe lines that surround the seal ring 300.

Although not intended to be limiting, embodiments of the present disclosure provide one or more of the following advantages. For example, embodiments of the present disclosure provide a semiconductor structure with a seal ring structure. The seal ring structure is formed using a process that is compatible with GAA fabrication process. In an embodiment, the seal ring includes a stack of semiconductor layers and a gate structure disposed directly above the stack of the semiconductor layers. The stack of the semiconductor layers does not undergo the channel release process performed to semiconductor layers in circuit region of the semiconductor structure, thereby providing a stable and robust base for the seal ring. In another embodiment, the seal ring includes gate structures disposed directly above dummy fins and further include EPI structures replacing an initial stack of semiconductor layers. The EPI structures provide a stable and robust base for the seal ring. Furthermore, in either embodiment above, gate structures can be continuous rings or segments of discrete rings. Embodiments of the present disclosure can be readily integrated into existing semiconductor manufacturing processes.

In one example aspect, the present disclosure is directed to a semiconductor structure that includes a substrate and a circuit region over the substrate. The circuit region includes two first source/drain structures of a transistor, first semiconductor layers connecting the two first source/drain structures, and a first gate structure disposed between the two first source/drain structures and wrapping around each of the first semiconductor layers. The semiconductor structure further includes a seal ring over the substrate and surrounding the circuit region. The seal ring includes two epitaxially grown semiconductor structures, second semiconductor layers, third semiconductor layers, and a second gate structure. The second and the third semiconductor layers are alternately stacked one over another to form a stack of layers. A topmost layer of the stack of layers is one of the third semiconductor layers. The second gate structure is disposed between the two epitaxially grown semiconductor structures and above the topmost layer of the stack of layers. The first and the third semiconductor layers include a first semiconductor material. The second semiconductor layers include a second semiconductor material that is different from the first semiconductor material.

In an embodiment of the semiconductor structure, each of the two epitaxially grown semiconductor structures forms a continuous ring from a top view. In a further embodiment, the second gate structure forms another continuous ring from the top view. In another further embodiment, the second gate structure is a segment of a discrete ring from the top view. In a further embodiment, the two epitaxially grown semiconductor structures are two portions of an epitaxially grown semiconductor layer, and the epitaxially grown semiconductor layer further includes two other portions that connect the two epitaxially grown semiconductor structures, wherein the two other portions and the two epitaxially grown semiconductor structures fully surround the second gate structure from the top view.

In an embodiment of the semiconductor structure, the seal ring further includes two isolation structures that form two continuous rings from a top view, wherein the second gate structure and the two epitaxially grown semiconductor structures are disposed between the two isolation structures from a top view. In a further embodiment, the second gate structure does not overlap with either one of the two isolation structures from the top view.

In an embodiment of the semiconductor structure, the first and the third semiconductor layers include crystalline silicon, the second semiconductor layers include silicon germanium, and the second gate structure includes a high-k metal gate. In another embodiment, the seal ring further includes dielectric inner spacers laterally between each of the second semiconductor layers and the two epitaxially grown semiconductor structures. In yet another embodiment, the seal ring further includes an interlayer dielectric layer above each of the two epitaxially grown semiconductor structures, and dielectric gate spacers laterally between the second gate structure and the interlayer dielectric layer.

In another example aspect, the present disclosure is directed to a semiconductor structure that includes a substrate, a circuit region over the substrate, and a seal ring over the substrate and surrounding the circuit region. The circuit region includes a gate-all-around transistor, wherein the gate-all-around transistor includes two first source/drain structures, first semiconductor layers connecting the two first source/drain structures, and a first gate structure disposed between the two first source/drain structures and wrapping around each of the first semiconductor layers. The seal ring includes two epitaxially grown semiconductor structures, an isolation structure disposed laterally between the two epitaxially grown semiconductor structures, and a second gate structure disposed directly above the isolation structure, wherein the two epitaxially grown semiconductor structures and the isolation structure form three continuous rings, respectively, from a top view.

In an embodiment of the semiconductor structure, the isolation structure includes a high-k dielectric layer above a layer having silicon dioxide, and the second gate structure includes a high-k metal gate. In another embodiment, the second gate structure forms a continuous ring from the top view.

In an embodiment of the semiconductor structure, the second gate structure is a segment of a discrete ring from the top view. In another embodiment, the seal ring further includes an interlayer dielectric layer above each of the two epitaxially grown semiconductor structures, and dielectric gate spacers laterally between the second gate structure and the interlayer dielectric layer.

In yet another example aspect, the present disclosure is directed to a method that includes providing a structure having a substrate and first and second semiconductor layers alternately stacked one over another above the substrate; etching the first and the second semiconductor layers to form a fin structure in a circuit region of the structure; and etching the first and the second semiconductor layers to form a first continuous ring in a seal ring region of the structure, wherein the first continuous ring surrounds the circuit region. The method further includes forming first isolation structures on both sides of the fin structure; forming a second isolation structure adjacent the first continuous ring in the seal ring region, wherein the second isolation structure forms a second continuous ring; forming a first dummy gate structure traversing the fin structure and the first isolation structures; and forming a second dummy gate structure that is disposed directly above the first continuous ring and does not overlap with the second continuous ring from a top view. The method further includes etching the fin structure using the first dummy gate structure as an etch mask to form two first trenches; etching the first continuous ring using the second dummy gate structure as another etch mask to form two second trenches; and epitaxially growing a third semiconductor layer in the first and the second trenches. The method further includes removing the first dummy gate structure, resulting in a first gate trench that exposes a topmost layer of the first semiconductor layers and sidewalls of the fin structure, wherein the sidewalls include side surfaces of the first and the second semiconductor layers. The method further includes removing the second dummy gate structure, resulting in a second gate trench that exposes the topmost layer of the first semiconductor layers and does not expose side surfaces of the first and the second semiconductor layers. The method further includes applying an etching process, wherein the etching process removes the second semiconductor layers in the fin structure through the first gate trench, wherein the second semiconductor layers in the first continuous ring is protected by the topmost layer of the first semiconductor layers from the etching process. The method further includes depositing a first gate structure in the first gate trench and depositing a second gate structure in the second gate trench.

In an embodiment, before the removing of the first dummy gate structure and the removing of the second dummy gate structure, the method further includes forming an interlayer dielectric layer over the first and the second dummy gate structures, the third semiconductor layer, and the first and the second isolation structures; and performing a chemical mechanical planarization process to the interlayer dielectric layer, thereby exposing the first and the second dummy gate structures.

In an embodiment, before the epitaxially growing of the third semiconductor layer, the method further includes laterally recessing the second semiconductor layers that are exposed in the first and the second trenches to form recesses and forming dielectric spacers in the recesses.

In an embodiment, the etching of the fin structure and the etching of the first continuous ring are performed simultaneously. In another embodiment, the removing of the first dummy gate structure and the removing of the second dummy gate structure are performed simultaneously.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
a circuit region over the substrate, wherein the circuit region includes two first source/drain structures of a transistor, first semiconductor layers connecting the two first source/drain structures, and a first gate structure disposed between the two first source/drain structures and wrapping around each of the first semiconductor layers; and
a seal ring over the substrate and surrounding the circuit region, wherein the seal ring includes two epitaxially grown semiconductor structures, second semiconductor layers, third semiconductor layers, and a second gate structure,
wherein the second and the third semiconductor layers are alternately stacked one over another to form a stack of layers, a topmost layer of the stack of layers is one of the third semiconductor layers, and the second gate structure is disposed between the two epitaxially grown semiconductor structures and above the topmost layer of the stack of layers, wherein the first and the third semiconductor layers include a first semiconductor material, and the second semiconductor layers include a second semiconductor material that is different from the first semiconductor material.

2. The semiconductor structure of claim 1, wherein each of the two epitaxially grown semiconductor structures forms a continuous ring from a top view.

3. The semiconductor structure of claim 2, wherein the second gate structure forms another continuous ring from the top view.

4. The semiconductor structure of claim 2, wherein the second gate structure is a segment of a discrete ring from the top view.

5. The semiconductor structure of claim 4, wherein the two epitaxially grown semiconductor structures are two portions of an epitaxially grown semiconductor layer, and the epitaxially grown semiconductor layer further includes two other portions that connect the two epitaxially grown semiconductor structures, wherein the two other portions and the two epitaxially grown semiconductor structures fully surround the second gate structure from the top view.

6. The semiconductor structure of claim 1, wherein the seal ring further includes two isolation structures that form two continuous rings from a top view, wherein the second gate structure and the two epitaxially grown semiconductor structures are disposed between the two isolation structures from a top view.

7. The semiconductor structure of claim 6, wherein the second gate structure does not overlap with either one of the two isolation structures from the top view.

8. The semiconductor structure of claim 1, wherein the first and the third semiconductor layers include crystalline silicon, the second semiconductor layers include silicon germanium, and the second gate structure includes a high-k metal gate.

9. The semiconductor structure of claim 1, wherein the seal ring further includes dielectric inner spacers laterally between each of the second semiconductor layers and the two epitaxially grown semiconductor structures.

10. The semiconductor structure of claim 1, wherein the seal ring further includes an interlayer dielectric layer above each of the two epitaxially grown semiconductor structures, and dielectric gate spacers laterally between the second gate structure and the interlayer dielectric layer.

11. A semiconductor structure, comprising:
a substrate;
a circuit region over the substrate, wherein the circuit region includes a gate-all-around transistor, wherein the gate-all-around transistor includes two first source/drain structures, first semiconductor layers connecting the two first source/drain structures, and a first gate structure disposed between the two first source/drain structures and wrapping around each of the first semiconductor layers; and
a seal ring over the substrate and surrounding the circuit region, wherein the seal ring includes two epitaxially grown semiconductor structures, an isolation structure disposed laterally between the two epitaxially grown semiconductor structures, and a second gate structure disposed directly above the isolation structure, wherein the second gate structure is spaced apart from the two epitaxially grown semiconductor structures, wherein the two epitaxially grown semiconductor structures and the isolation structure form three continuous rings, respectively, from a top view.

12. The semiconductor structure of claim 11, wherein the isolation structure includes a high-k dielectric layer above a layer having silicon dioxide, and the second gate structure includes a high-k metal gate.

13. The semiconductor structure of claim 11, wherein the second gate structure forms a continuous ring from the top view.

14. The semiconductor structure of claim 11, wherein the second gate structure is a segment of a discrete ring from the top view.

15. The semiconductor structure of claim 11, wherein the seal ring further includes an interlayer dielectric layer above each of the two epitaxially grown semiconductor structures, and dielectric gate spacers laterally between the second gate structure and the interlayer dielectric layer,
wherein the seal ring further includes two semiconductor layers protruding from the substrate,
wherein the two epitaxially grown semiconductor structures are disposed over the two semiconductor layers.

16. A semiconductor device, comprising:
a structure having a substrate and first and second semiconductor layers alternately stacked one over another above the substrate, the first and the second semiconductor layers etched to form a fin structure in a circuit region of the structure;
a first continuous ring in a seal ring region of the structure, wherein the first continuous ring is formed from the first and the second semiconductor layers and surrounds the circuit region;
a first isolation structures on both sides of the fin structure;
a second isolation structure adjacent the first continuous ring in the seal ring region, wherein the second isolation structure forms a second continuous ring;
forming a first dummy gate structure traversing the fin structure and the first isolation structures;
forming a second dummy gate structure that is disposed directly above the first continuous ring and does not overlap with the second continuous ring from a top view;
two first trenches formed in the fin structure and traversing the fin structure;
two second trenches formed in the first continuous ring;
a third epitaxial semiconductor layer in the first and the second trenches;
a first gate trench that exposes a topmost layer of the first semiconductor layers and sidewalls of the fin structure, wherein the sidewalls include side surfaces of the first and the second semiconductor layers;
a second gate trench that exposes the topmost layer of the first semiconductor layers and does not expose side surfaces of the first and the second semiconductor layers;
wherein the second semiconductor layer is removed in the fin structure, wherein the second semiconductor layers in the first continuous ring remains;
a first gate structure in the first gate trench; and
a second gate structure in the second gate trench.

17. The semiconductor device of claim 16, further comprising:
an interlayer dielectric layer over the third semiconductor layer, and the first and the second isolation structures;
wherein the interlayer dielectric layer is planarized.

18. The semiconductor device of claim 16, wherein the second semiconductor layers include recesses in the first and the second trenches, the device further comprising:
dielectric spacers in the recesses.

19. The semiconductor device of claim 16, wherein the seal ring further includes an interlayer dielectric layer above each of two epitaxially grown semiconductor structures.

20. The semiconductor device of claim 19, wherein the seal ring further includes dielectric gate spacers positioned laterally between the second gate structure and the interlayer dielectric layer.

* * * * *